(12) United States Patent
Kozaki

(10) Patent No.: US 11,551,952 B2
(45) Date of Patent: Jan. 10, 2023

(54) VACUUM VALVE, METHOD OF CONTROLLING VACUUM VALVE, AND ESTIMATION DEVICE

(71) Applicant: SHIMADZU CORPORATION, Kyoto (JP)

(72) Inventor: Junichiro Kozaki, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 17/511,475

(22) Filed: Oct. 26, 2021

(65) Prior Publication Data

US 2022/0165594 A1 May 26, 2022

(30) Foreign Application Priority Data

Nov. 26, 2020 (JP) .............................. JP2020-196276

(51) Int. Cl.
*H01L 21/67* (2006.01)
*G01L 27/00* (2006.01)
(Continued)

(52) U.S. Cl.
CPC ........ *H01L 21/67253* (2013.01); *G01L 27/00* (2013.01); *G05D 16/2013* (2013.01); *F16K 31/02* (2013.01); *F16K 37/0083* (2013.01); *G05D 16/024* (2019.01); *G05D 16/202* (2013.01); *H01L 21/67017* (2013.01)

(58) Field of Classification Search
CPC ......... H01L 21/67253; H01L 21/67017; G01L 27/00; G05D 16/2013; G05D 16/202; G05D 16/024; F16K 31/02; F16K 37/0083; F04D 27/001; F04D 27/008; F04D 19/042

USPC ...... 137/14, 487.5, 526, 565.23; 156/345.15, 156/345.24, 345.26; 118/715
See application file for complete search history.

(56) References Cited

U.S. PATENT DOCUMENTS 5,580,421 A * 12/1996 Hiatt ................. H01L 21/02046
257/E21.258
7,647,886 B2 * 1/2010 Kubista ............... C23C 16/4412
118/663
(Continued)

FOREIGN PATENT DOCUMENTS

JP 2020009111 A 1/2020
JP 2020021476 A 2/2020

*Primary Examiner* — Minh Q Le
(74) *Attorney, Agent, or Firm* — Renner, Otto, Boisselle & Sklar, LLP

(57) ABSTRACT

A controller includes an opening degree control section configured to control a valve element opening degree of the valve main body based on a pressure measurement value of the vacuum chamber measured by a vacuum meter, and an estimation section configured to estimate measurement lag information of pressure measurement value with respect to a pressure of the vacuum chamber based on (a) an exhaust expression including a second-order derivative term of the pressure measurement value and indicating a relationship between an effective exhaust speed of a vacuum pumping system for the vacuum chamber and the pressure measurement value and (b) a pressure measurement value measured during a pressure response when the valve element opening degree is step-changed, and the opening degree control section controls the valve element opening degree based on the measurement lag information estimated by the estimation section.

13 Claims, 12 Drawing Sheets

(51) Int. Cl.
  *G05D 16/20* (2006.01)
  *G05D 16/00* (2006.01)
  *F16K 31/02* (2006.01)
  *F16K 37/00* (2006.01)

(56) References Cited

U.S. PATENT DOCUMENTS

| | | | |
|---|---|---|---|
| 8,481,434 B2* | 7/2013 | Miya | H01L 21/31645 |
| | | | 118/712 |
| 10,809,620 B1* | 10/2020 | Carcasi | H01L 21/67253 |
| 2006/0175012 A1* | 8/2006 | Lee | C23C 16/4486 |
| | | | 438/758 |
| 2008/0047607 A1* | 2/2008 | Horsky | H01J 37/3171 |
| | | | 137/487 |
| 2009/0071505 A1* | 3/2009 | Miya | C23C 16/4405 |
| | | | 134/4 |
| 2011/0277933 A1* | 11/2011 | Nonomura | H01J 37/32935 |
| | | | 156/345.24 |
| 2012/0227830 A1* | 9/2012 | Eto | G05D 16/202 |
| | | | 137/67 |
| 2013/0149872 A1* | 6/2013 | Hirose | H01L 21/02183 |
| | | | 438/762 |
| 2015/0111388 A1* | 4/2015 | Takahashi | H01L 21/31116 |
| | | | 156/345.26 |
| 2018/0196449 A1* | 7/2018 | Hirata | F16K 37/005 |
| 2018/0259983 A1* | 9/2018 | Madlener | F16K 37/0041 |
| 2019/0107110 A1* | 4/2019 | Kozaki | F04D 17/168 |
| 2019/0196516 A1* | 6/2019 | Kozaki | F16K 37/0041 |
| 2019/0293201 A1* | 9/2019 | Kozaki | G05D 16/208 |
| 2020/0109706 A1* | 4/2020 | Kozaki | F04B 37/14 |
| 2020/0272178 A1* | 8/2020 | Kozaki | G05D 16/02 |
| 2021/0202232 A1* | 7/2021 | Nishida | C23C 16/4584 |
| 2021/0286384 A1* | 9/2021 | Kozaki | G05D 16/208 |
| 2021/0292895 A1* | 9/2021 | Li | H01L 21/67017 |
| 2022/0235787 A1* | 7/2022 | Kozaki | F04D 27/001 |

\* cited by examiner

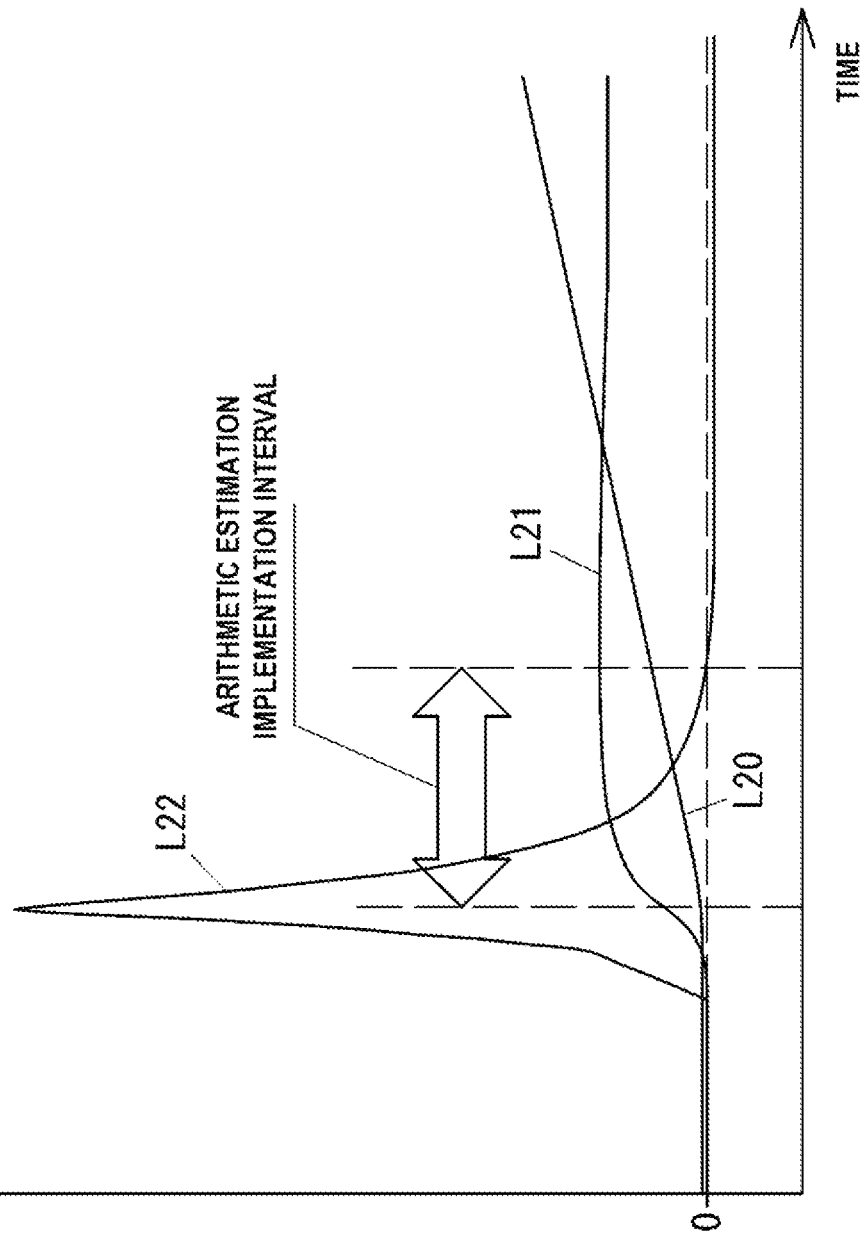

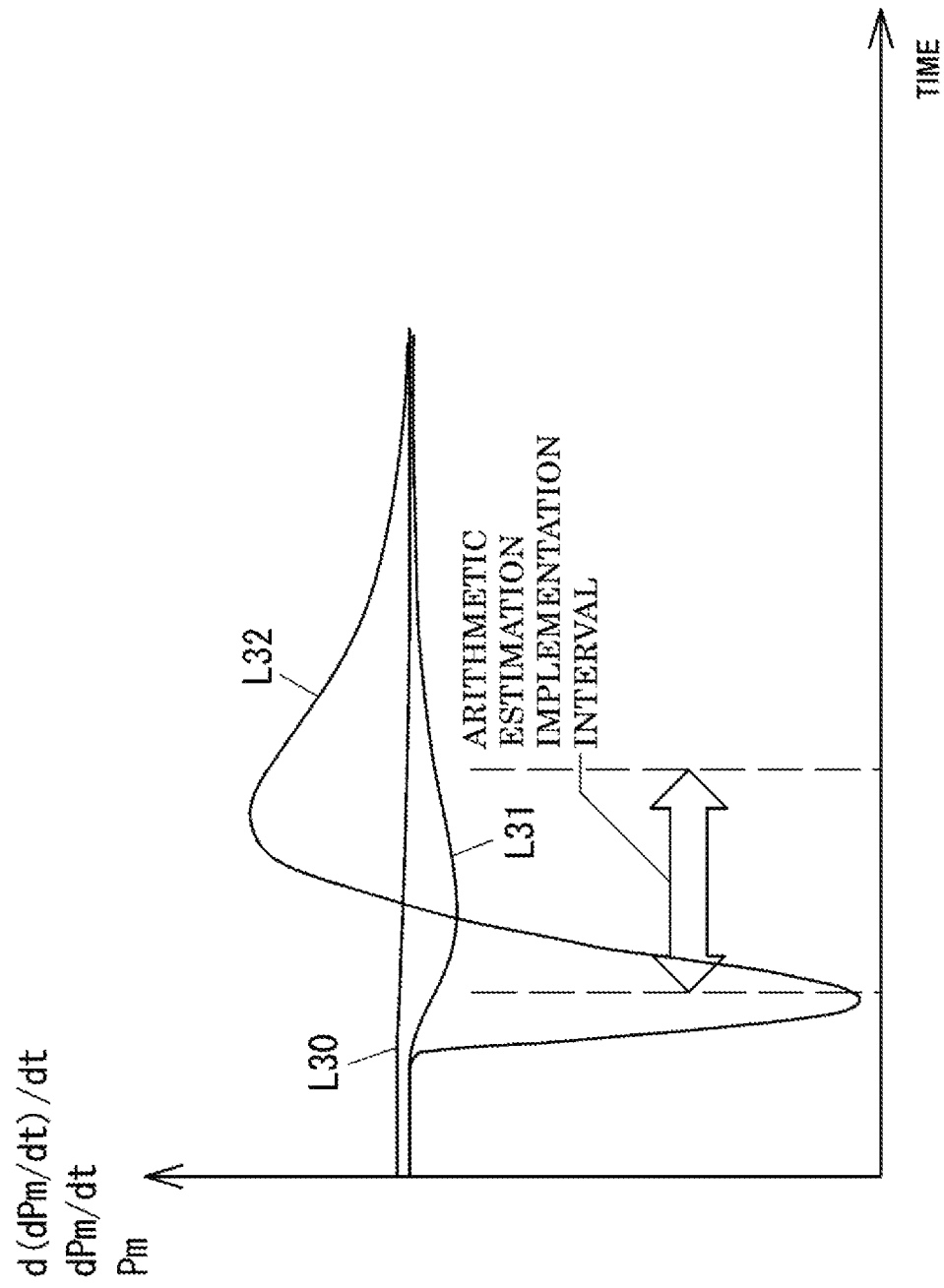

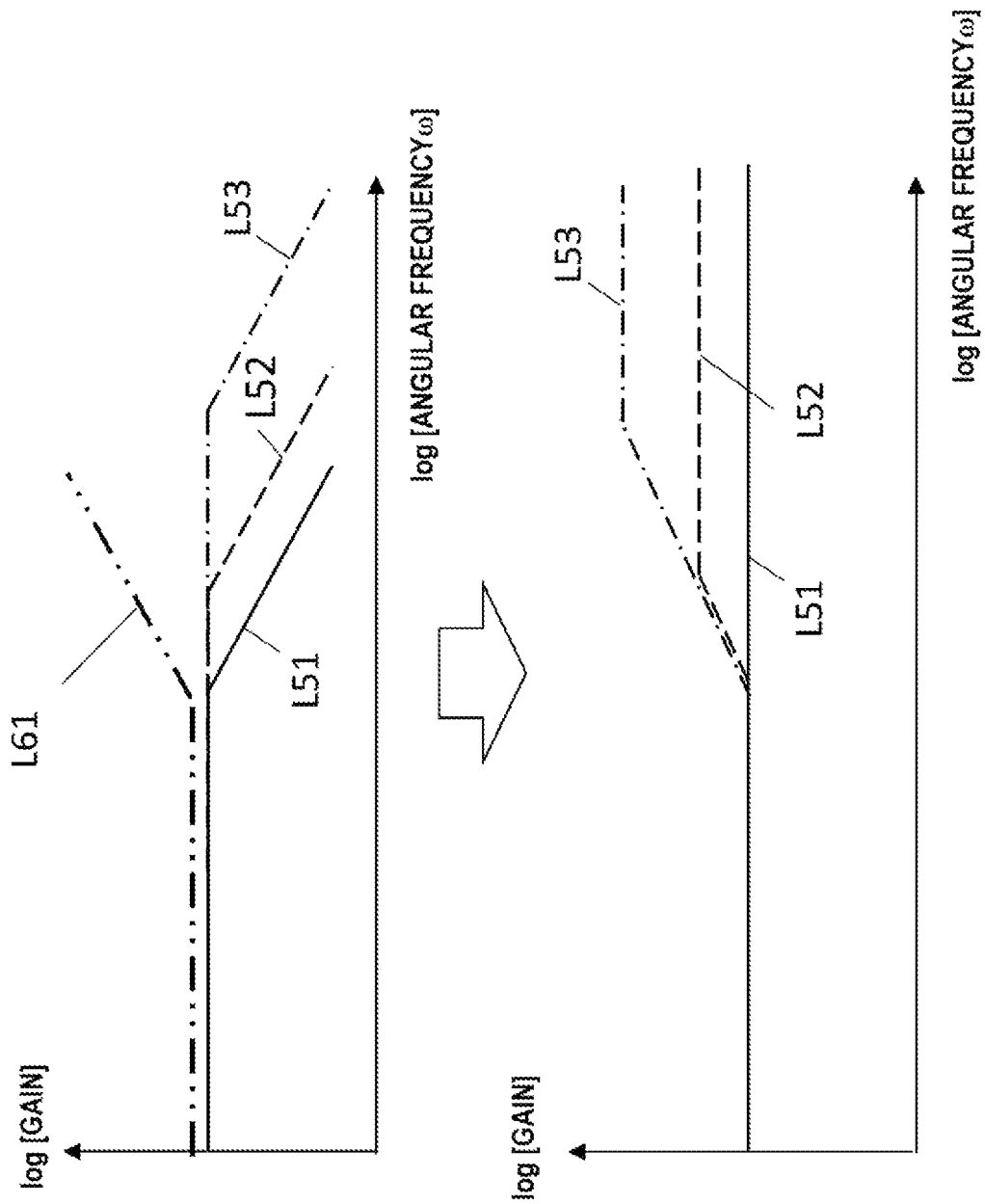

VACUUM VALVE, METHOD OF CONTROLLING VACUUM VALVE, AND ESTIMATION DEVICE

BACKGROUND OF THE INVENTION

1. Technical Field

The present invention relates to a vacuum valve and an estimation device.

2. Background Art

In a semiconductor process (e.g., dry etching), process gas is injected into a chamber through a flow rate controller. In the chamber, physical/chemical processing such as etching or film formation is performed for a wafer surface by means of the injected gas, and the gas is pumped out to a downstream side of the chamber. For the process gas to be injected into the chamber, conditions such as a gas type and an injected gas flow rate Qin are set in advance. The process gas is adjusted by the flow rate controller such that these conditions are satisfied. A chamber pressure Pr is also one of important process conditions. The chamber pressure is measured by a vacuum meter. By performing control of a valve element opening degree position of a valve such that the chamber pressure reaches a predetermined pressure value set in advance, an exhaust flow rate is adjusted and the chamber pressure is held at the predetermined pressure value.

Normally, as the process conditions, different conditions are included in each of multiple steps. The processing proceeds while the condition (a first condition, a second condition, . . . ) is being switched in every predetermined time in each step. At this point, it is necessary for ensuring manufacturing process uniformity to promptly smoothly converge the pressure to a subsequent predetermined pressure value (a target pressure value) at switching timing between the steps. Thus, an automatic pressure control valve (an APC valve) configured to drivably control a valve element by a motor is used as the valve.

In the APC valve, initial calibration processing is performed as a preparation for use. Generally, arithmetic estimation (or measurement) of a chamber volume V and arithmetic measurement of an effective exhaust speed for each valve element opening degree are often performed with an easily-handleable single type of rare gas (e.g., He or Ar). The chamber volume varies according to a user's vacuum process device, and a time lag caused in measurement of the chamber pressure also varies. Thus, a measurement lag time is obtained by arithmetic estimation (or measurement) in the calibration processing in some cases (see Patent Literature 1 (JP-A-2020-009111) and Patent Literature 2 (JP-A-2020-021476)).

In any of the Patent Literatures 1 and 2, an exhaust expression taking the lag into consideration is derived from an exhaust expression (Qin=V×dP/dt+Se(θ)×P) and a primary lag element associated with a time lag caused due to a gauge pipe of the vacuum meter. Further, such an expression is approximated to an expression ignoring a pressure second-order derivative amount. Then, based on this approximated exhaust expression, a measurement lag amount is estimated from a time measured when a pressure response in the case of increasing the opening degree and the case of decreasing the opening degree reaches a final balance pressure value of 63% and the chamber volume value acquired in advance and the effective exhaust speed value measured and acquired in advance.

SUMMARY OF THE INVENTION

However, in Patent Literatures 1 and 2, there are problems that an estimation error is great because the exhaust expression is approximated to the expression ignoring the pressure second-order derivative amount and these techniques can be applied only to the case of a relatively-great measurement lag amount targeted for estimation.

A vacuum valve comprises: a valve main body attached to between a vacuum pump and a vacuum chamber; and a controller. The controller includes an opening degree control section configured to control a valve element opening degree of the valve main body based on a pressure measurement value of the vacuum chamber measured by a vacuum meter, and an estimation section configured to estimate measurement lag information of pressure measurement value with respect to a pressure of the vacuum chamber based on (a) an exhaust expression including a second-order derivative term of the pressure measurement value and indicating a relationship between an effective exhaust speed of a vacuum pumping system for the vacuum chamber and the pressure measurement value and (b) a pressure measurement value measured during a pressure response when the valve element opening degree is step-changed, and the opening degree control section controls the valve element opening degree based on the measurement lag information estimated by the estimation section.

According to the present invention, the measurement lag amount can be estimated with favorable accuracy, and pressure adjustment control can be more properly performed.

BRIEF DESCRIPTION OF THE DRAWINGS

FIG. 6 is a graph showing a change in Pm, dPm/dt, and d(dPm/dt)/dt in an arithmetic estimation implementation interval of FIGS. 5A and 5B;

FIG. 8 is a graph showing a change in Pm, dPm/dt, and d(dPm/dt)/dt in an arithmetic estimation implementation interval of FIGS. 7A and 7B;

FIGS. 11A and 11B are graphs showing one example of improper lag correction.

DETAILED DESCRIPTION OF THE EXEMPLARY EMBODIMENTS

Figure 1:
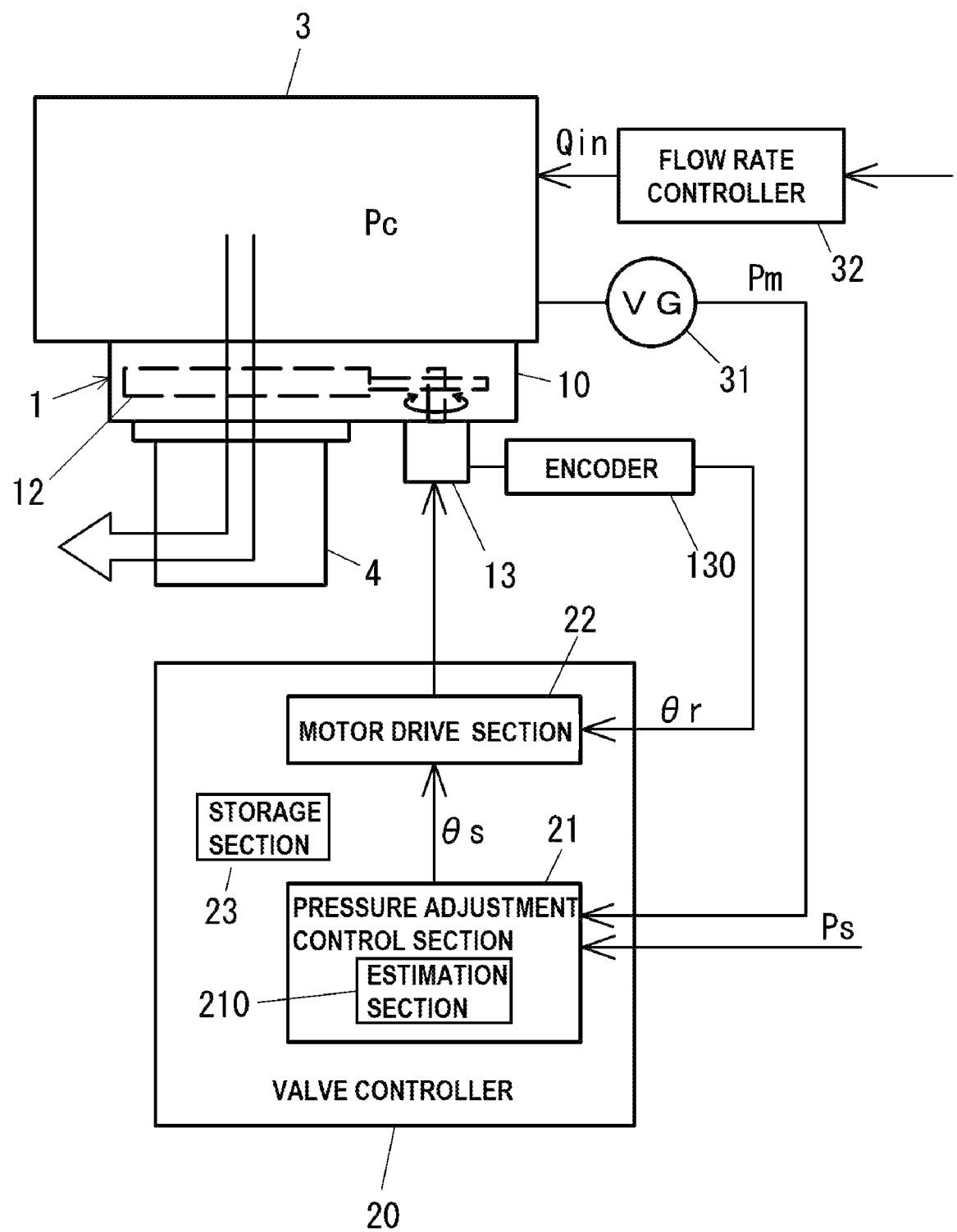
FIG. 1 is a block diagram showing a schematic configuration of a vacuum valve attached to a vacuuming device.

Hereinafter, a mode for carrying out the present invention will be described with reference to the drawings. FIG. 1 is a block diagram showing a schematic configuration of a vacuum valve attached to a vacuuming device. The vacuum valve 1 is an APC valve, and includes a valve main body 10 provided with a valve element 12 and a valve controller 20 configured to control valve element drive. The valve main body 10 is attached to between a vacuum chamber 3 and a vacuum pump 4. Gas such as process gas is injected into the vacuum chamber 3 through a flow rate controller 32. The flow rate controller 32 is a device configured to control the flow rate Qin of gas injected into the vacuum chamber 3, and is controlled by a main controller (not shown) of the vacuuming device provided with the vacuum chamber 3. A pressure (a chamber pressure Pc) in the vacuum chamber 3 is measured by a vacuum meter 31.

A motor 13 configured to openably drive the valve element 12 is provided at the valve main body 10. Note that in an example shown in FIG. 1, the valve element 12 is openably driven by sliding, but the present invention is not limited to such a configuration and can be applied to vacuum valves in various opening/closing forms. The valve element 12 is swingably driven by the motor 13. An encoder 130 configured to detect the opening/closing angle of the valve element 12 is provided at the motor 13. A detection signal of the encoder 130 is input to a valve control device 2 as an opening degree signal Or (hereinafter referred to as an opening degree measurement value Or) of the valve element 12.

The valve controller 20 configured to control the valve main body 10 includes a pressure adjustment control section 21, a motor drive section 22, and a storage section 23. The storage section 23 stores parameters necessary for valve control, such as correlation data $Se(\theta)$ between a valve element opening degree $\theta$ and an effective exhaust speed Se for a gas type as a reference, in advance. The motor drive section 22 includes an inverter circuit for motor drive and a motor control circuit configured to control the inverter circuit, and the opening degree measurement value Or from the encoder 130 is input to the motor drive section 22. A pressure measurement value Pm measured by the vacuum meter 31 is input to the pressure adjustment control section 21, and a target pressure Ps of the vacuum chamber 3 is input to the pressure adjustment control section 21 from the main controller of the vacuuming device described above.

The pressure adjustment control section 21 outputs an opening degree signal $\theta s$ for controlling the opening degree $\theta$ of the valve element 12 to the motor drive section 22 based on the pressure measurement value Pm and the target pressure Ps. The motor drive section 22 drives the motor 13 based on the opening degree signal $\theta s$ input from the pressure adjustment control section 21 and the opening degree measurement value Or of the valve element 12 input from the encoder 130. The pressure adjustment control section 21 includes an estimation section 210 configured to estimate gas exhaust response information including later-described measurement lag information. Detailed description regarding estimation of the gas exhaust response information by the estimation section 210 will be made later. The valve controller 20 includes a computer, and for example, includes an arithmetic processing device such as a microcomputer having a CPU, a memory (a ROM, a RAM), a peripheral circuit and the like. The valve controller 20 implements the functions of the pressure adjustment control section 21 and a motor control section of the motor drive section 22 by software programs stored in the ROM. The memory of the microcomputer forms the storage section 23. Alternatively, a digital arithmetic processor such as a field programmable gate array (FPGA) and a peripheral circuit thereof may form the valve controller 20.

Figure 2:
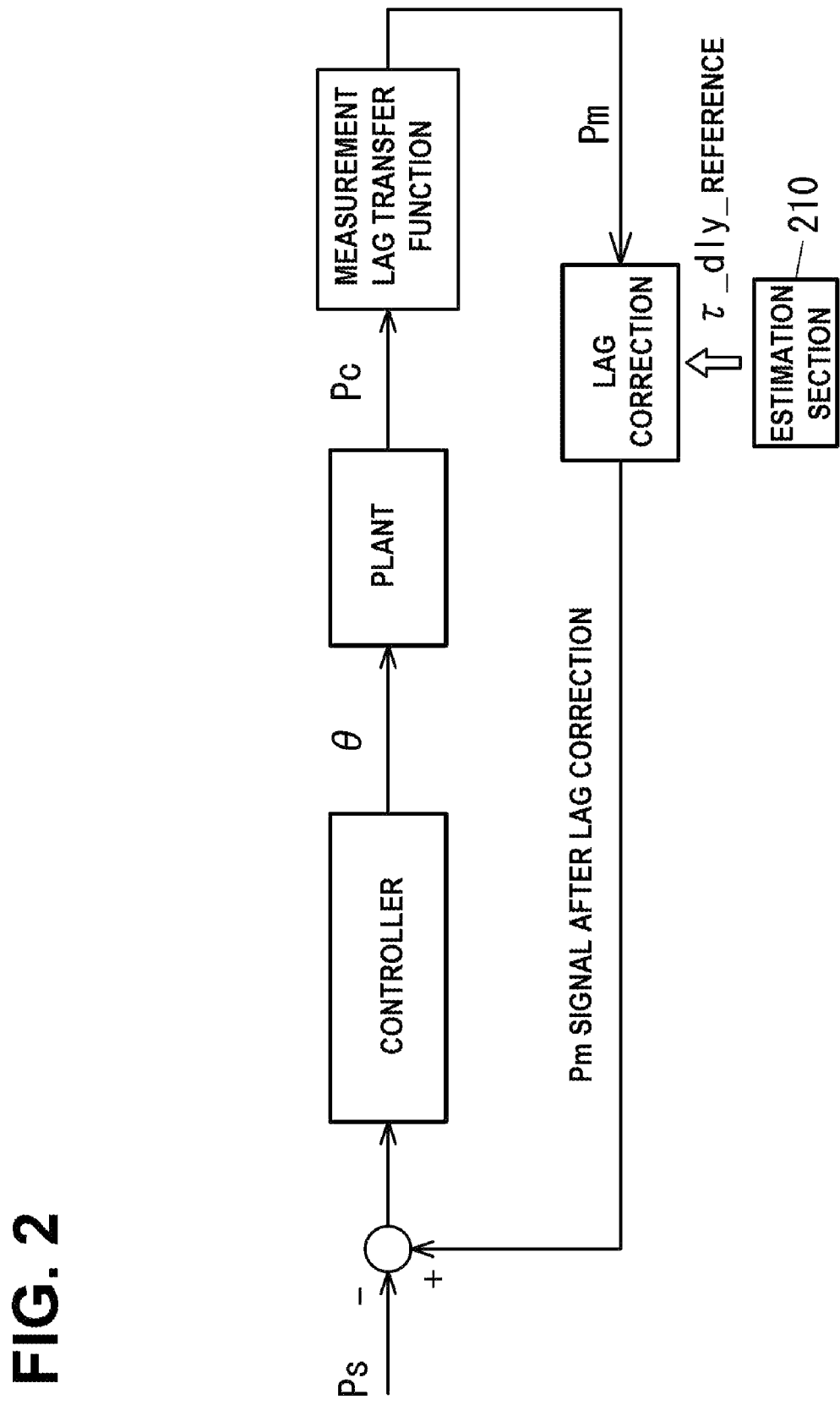
FIG. 2 is a block diagram showing a pressure adjustment control system of the vacuum valve of the present embodiment.

FIG. 2 is a block diagram showing a pressure adjustment control system of the vacuum valve of the present embodiment. As shown in FIG. 2, the control system is represented by each block of a control target (a plant), a control unit (a controller), a measurement lag transfer function, lag correction, and the above-described estimation section. The chamber pressure Pc as a plant output is detected by the vacuum meter 31, and by feedback of the pressure measurement value Pm, is controlled to reach a predetermined pressure value (the target pressure Ps) set as a target. In the present embodiment, there is a lag in the pressure measurement value Pm with respect to the chamber pressure Pc due to, e.g., influence of a gauge pipe as described above, and for this reason, the pressure measurement value Pm is lag-corrected based on the measurement lag information estimated by the estimation section 210 and a signal after lag correction is fed back.

A correspondence to the configuration of FIG. 1 will be described. The plant is a gas exhaust section of the valve main body 10 taking the opening degree $\theta$ of the valve element 12 as an input and taking the chamber pressure Pc as an output. The controller is the pressure adjustment control section 21 and an actuator section including the motor 13 configured to drive the valve element 12, and a controller input is a deviation between the target pressure Ps and the pressure measurement value Pm. A controller output is the opening degree $\theta$ of the valve element 12. The lag correction is performed by the pressure adjustment control section 21. Hereinafter, arithmetic estimation in the estimation section 210 will be described first, and then, application of an estimation result to pressure adjustment control will be described.

[1. Description of Arithmetic Estimation]

(1-1. Principle of Estimation of Measurement Lag Time $\tau\_dly$)

Estimation of a measurement lag time $\tau\_dly$ in the estimation section 210 will be described. Estimation of the measurement lag time $\tau\_dly$ is performed by initial calibration processing performed upon use of the vacuum valve. In the present embodiment, it is assumed that the injected gas flow rate Qin of gas to be applied in the calibration processing is known, but the gas type is unknown.

As typically known, an exhaust expression represented by Expression (1) below is satisfied in the response of the chamber pressure Pc. In Expression (1), Qin represents the injected gas flow rate, V represents the volume of the vacuum chamber 3, dPc/dt represents the time derivative of the chamber pressure Pc, and Se represents the effective exhaust speed, which is determined by a conductance according to a chamber structure and the valve opening degree and the exhaust speed of the vacuum pump on a valve downstream side, in the vacuum chamber 3.

$$Qin = V \times (dPc/dt) + Se \times Pc \qquad (1)$$

A pipe conductance between the vacuum chamber 3 and the vacuum meter 31 decreases due to, e.g., the gauge pipe or an orifice in the middle of the pipe, and the lag in the pressure measurement value Pm measured by the vacuum meter 31 with respect to a change in the chamber pressure Pc increases. In the present embodiment, such a time lag will be referred to as the measurement lag time $\tau\_dly$. The pressure measurement value Pm is an output having passed through a primary lag element in a case where the chamber pressure Pc is taken as an input, and the measurement lag transfer function in FIG. 2 is represented as in "$(1/\tau\_dly)/\{S+(1/\tau\_dly)\}$" (where S represents a Laplace transform complex number). That is, a relationship represented by Expression (2) below is satisfied between the pressure measurement value Pm and the chamber pressure Pc.

$$\tau\_dly \times (dPm/dt) + Pm = Pc \qquad (2)$$

When Expression (2) is substituted into Expression (1), Expression (3) below is obtained.

$$Qin/Se = \qquad (3)$$
$$V/Se \times \tau\_dly \times d(dPm/dt)/dt + (V/Se + \tau\_dly) \times (dPm/dt) + Pm$$

It can be said that Expression (1) above is an exhaust expression represented using the chamber pressure Pc and Expression (3) is an exhaust expression represented using the pressure measurement value Pm having the measurement lag time $\tau\_dly$ with respect to the chamber pressure Pc. In the present embodiment, Expression (3) as a second-order ordinary differential equation is, regarding the pressure measurement value Pm, employed as a basic expression for obtaining the measurement lag time $\tau\_dly$.

Figure 3:
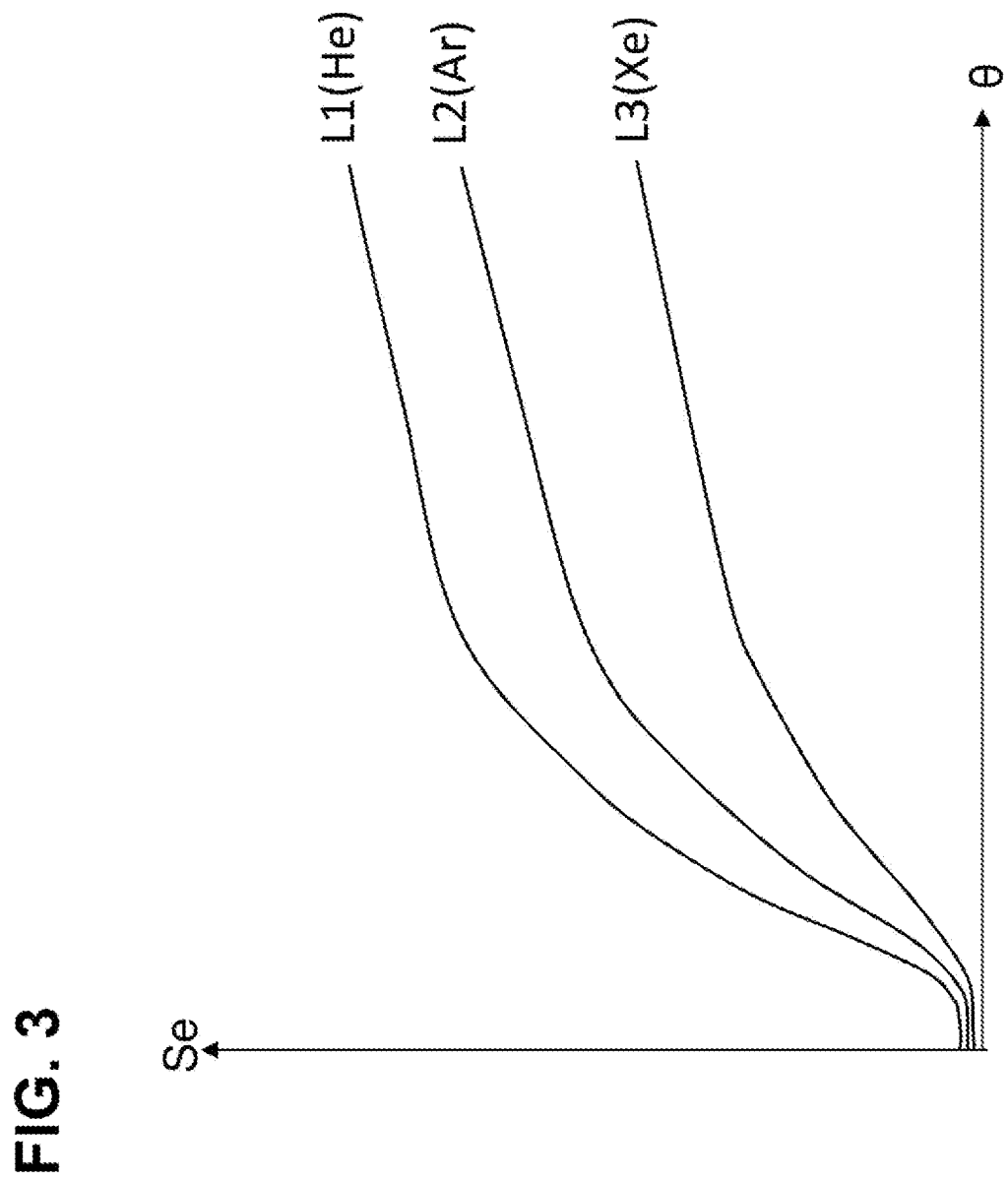
FIG. 3 is a graph showing a relationship between an opening degree θ and an effective exhaust speed Se.

The effective exhaust speed Se is in a monotonically-increasing relationship with the opening degree $\theta$ of the valve element 12 as shown in FIG. 3. In a case where influence of the structure of the vacuum chamber 3 on the effective exhaust speed Se can be ignored, the effective exhaust speed Se is determined by the exhaust speed Sp of the vacuum pump 4 and the conductance Cv of the vacuum valve 1 as in Expression (4) below.

$$Se = 1/(1/Cv + 1/Sp) \qquad (4)$$

Figure 4:
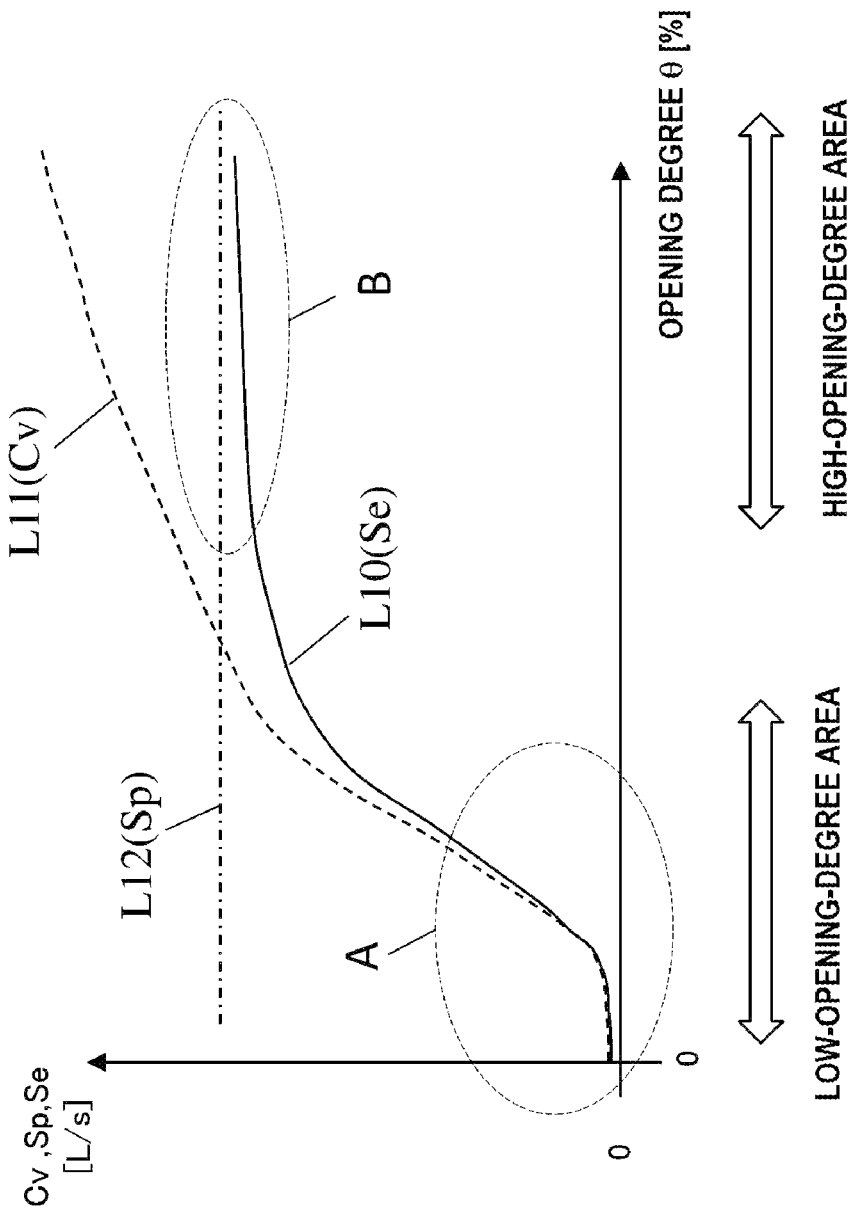
FIG. 4 is a graph for describing the characteristics of an effective exhaust speed Se(θ)

The conductance Cv changes according to the opening degree $\theta$ of the valve element 12, and therefore, the effective exhaust speed Se represented by Expression (4) is represented as in Se($\theta$). The relationship between the opening degree $\theta$ and the effective exhaust speed Se($\theta$) generally shows a trend as shown in FIG. 4. That is, for the effective exhaust speed Se($\theta$) indicated by a line L10, the conductance Cv (a line L11) of the valve is dominant in an area (a low opening degree) A with a low opening degree $\theta$, and the exhaust speed Sp (a line L12) of the vacuum pump is dominant in an area (a high opening degree) B with a high opening degree $\theta$. Note that the effective exhaust speed Se depends not only on the opening degree $\theta$ but also on the injected gas flow rate Qin, but influence of the injected gas flow rate Qin is small. Thus, in the present embodiment, the effective exhaust speed Se will be described only as the function of the opening degree $\theta$ such as Se($\theta$). When Se in Expression (3) is described as Se($\theta$), Expression (5) below is obtained as a basic expression for obtaining the measurement lag time $\tau\_dly$. Expression (5) represents such conversion that the sum of the second-order derivative term of the pressure measurement value Pm, the first-order derivative term of the pressure measurement value Pm, and the term of the pressure measurement value Pm on the right-hand side has equality with a change in Qin/Se($\theta$) on the left-hand side.

$$Qin/Se(\theta) = \qquad (5)$$
$$V/Se(\theta) \times \tau\_dly \times d(dPm/dt)/dt + (V/Se(\theta) + \tau\_dly) \times (dPm/dt) + Pm$$

(1-2. Arithmetic Estimation of Measurement Lag Time $\tau\_dly$)

Next, one example of the method for performing arithmetic estimation of the measurement lag time $\tau\_dly$ based on Basic Expression (5) will be described. As described above, Qin is known in Expression (5). Moreover, the pressure measurement value Pm is a known amount measured by the vacuum meter 31, and dPm/dt and d(dPm/dt)/dt can be taken as known values because a difference value of the pressure measurement value Pm and a difference value of dPm/dt can be used as substitutions for dPm/dt and d(dPm/dt)/dt.

On the other hand, the valve element opening degree $\theta$ (=$\theta r$) is a known measurement value, but the effective exhaust speed Se($\theta$) of Expression (5) is an unknown amount because the injected gas type is unknown. Note that the correlation data Se($\theta$), which is stored in the storage section 23 in advance, between the valve element opening degree $\theta$ and the effective exhaust speed Se is an effective exhaust speed for the gas type as the reference. Note that the effective exhaust speed for the known gas type as the reference will be hereinafter represented as Se_Reference. Moreover, the chamber volume V (a constant value) and the measurement lag time $\tau\_dly$ (a constant value) to be obtained are also unknown.

When Expression (5) is rewritten using $\alpha$, $\beta$, and $\gamma$ which are amounts represented by $\alpha$=Qin/Se($\theta$), $\beta=\{V/Se(\theta)\}\times \tau\_dly$, and $\gamma$=V/Se($\theta$)+$\tau\_dly$, Expression (6) is obtained. Expression (6) is an expression including three unknown numbers $\alpha$, $\beta$, $\gamma$ and three known amounts Pm, dPm/dt, d(dPm/dt)/dt, and can be interpreted as an expression taking ($\alpha$, $\beta$, $\gamma$) as a variable. Expression (6) is constantly satisfied at an optional time in a pressure response process according to an opening degree step change (a stepwise opening degree change).

$$1 \times \alpha - (d(dPm/dt)/dt) \times \beta - (dPm/dt) \times \gamma = Pm \qquad (6)$$

When the opening degree $\theta$ is a constant opening degree even after the step change, Se($\theta$) included in the unknown numbers $\alpha$, $\beta$, and $\gamma$ is also unknown, but is a constant value. Thus, it is recognized that ($\alpha$, $\beta$, $\gamma$) satisfying Expression (6) is unknown, but is a constant value ($\alpha 0$, $\beta 0$, $\gamma 0$). This will be geometrically described. In Expression (6) as the equation of a plane in an $\alpha$, $\beta$, $\gamma$ space, each coefficient (1, d(dPm/dt)/dt, dPm/dt) of ($\alpha$, $\beta$, $\gamma$) changes every second in association with a change in the pressure measurement value Pm. Thus, the orientation (a perpendicular normal vector) of the plane with the variable ($\alpha$, $\beta$, $\gamma$) changes every second, but such a plane constantly has an intersection at the constant value ($\alpha 0$, $\beta 0$, $\gamma 0$).

A measurement value generally has an error. Specifically, the second-order derivative value d(dPm/dt)/dt of the pressure measurement value Pm has a great error due to great noise influence because such a value is obtained from a second-order difference value of the pressure measurement value Pm. Thus, the above-described intersection ($\alpha 0$, $\beta 0$, $\gamma 0$) is not present in a precise sense, and for this reason, one example of the method for estimating a statistically-certain intersection will be described herein.

First, in the middle of the response after the opening degree $\theta$ has been step-changed, the pressure measurement value Pm is sampled at multiple points. It is assumed that the number k of samples is k=1, 2, 3, ..., K and each sampling time is t1, t2, ..., tK. When the pressure measurement value Pm sampled at the time tk is represented as in Pm|t=tk, the coefficient of Plane ($\alpha$, $\beta$, $\gamma$)|t=tk, i.e., the coefficients of $\alpha$, $\beta$, and $\gamma$ of Expression (6), is represented as in 1, −(d(dPm/dt)/dt)|t=tk, and −(dPm/dt)|t=tk, and the constant term Pm is Pm|t=tk. An expression for a distance between each of K planes ($\alpha$, $\beta$, $\gamma$)|t=tk and the intersection ($\alpha 0$, $\beta 0$, $\gamma 0$) is derived, and each distance is taken as Lk. Although an expression for formulation is omitted, ($\alpha$, $\beta$, $\gamma$) can be deleted, and formulation can be performed using ($\alpha 0$, $\beta 0$, $\gamma 0$) as an unknown number. It can be said that ($\alpha 0$, $\beta 0$, $\gamma 0$) at which the square sum ($\Sigma Lk^2$) of these distances Lk is minimum is a reasonable statistically-certain intersection. For obtaining this value, simultaneous equations with three variables may be solved as in the case of the least-squares method, ($\Sigma Lk^2$) being partially differentiated using each of $\alpha 0$, $\beta 0$, and $\gamma 0$ to obtain zero according to these simultaneous equations. As a result, the intersection ($\alpha 0$, $\beta 0$, $\gamma 0$) is obtained.

For the obtained ($\alpha 0$, $\beta 0$, $\gamma 0$), $\alpha 0$=Qin/Se($\theta$), $\beta 0$={V/Se($\theta$)}×$\tau$_dly, and $\gamma 0$=V/Se($\theta$)+$\tau$_dly are satisfied. From $\alpha 0$=Qin/Se($\theta$), the effective exhaust speed Se($\theta$) regarding the unknown injected gas type is obtained as in Se($\theta$)=$\alpha 0$/Qin. The opening degree $\theta$ is an opening degree (a constant value) upon sampling. Moreover, $\beta 0$ is the "product" of V/Se($\theta$) and $\tau$_dly and $\gamma 0$ is the "sum" of V/Se($\theta$) and $\tau$_dly. Thus, V/Se($\theta$) and $\tau$_dly are the solution of a quadratic equation represented by Expression (7) taking $\beta 0$ and $\gamma 0$ as coefficients. The solution is as in Expression (8).

$$x^2 - \gamma 0 \cdot x + \beta 0 = 0 \tag{7}$$

$$x = \{\gamma 0 \pm \sqrt{(\gamma 0^2 - 4\beta 0)}\}/2 \tag{8}$$

Practically, a value of the order of about 0.1 is necessary as the measurement lag time $\tau$_dly. Moreover, V/Se($\theta$) as the time constant of the pressure response is of the order of about 0.1 in a case where the valve element opening degree $\theta$ is a high opening degree, and is of the order of about 10 in a case where the valve element opening degree $\theta$ is a low opening degree. Thus, it may be assumed that ($\tau$_dly) V/Se($\theta$) is satisfied in a case where the opening degree $\theta$ after the opening degree step change is a high opening degree and ($\tau$_dly) V/Se($\theta$) is satisfied in a case where the opening degree $\theta$ after the opening degree step change is a low opening degree.

That is, in a case where the opening degree $\theta$ after the opening degree step change is a high opening degree, the measurement lag time $\tau$_dly and the time constant V/Se($\theta$) are represented by Expressions (9A) and (9B) below, and the chamber volume V is represented as in Expression (10) from Expression (9B) and $\alpha 0$=Qin/Se($\theta$).

$$\tau\_dly = \{\gamma 0 + \sqrt{(\gamma 0^2 - 4\beta 0)}\}/2 \tag{9A}$$

$$V/Se(\theta) = \{\gamma 0 - \sqrt{(\gamma 0^2 - 4\beta 0)}\}/2 \tag{9B}$$

$$V = (\alpha 0/(Qin)\{\gamma 0 - \sqrt{(\gamma 0^2 - 4\beta 0)}\}/2 \tag{10}$$

On the other hand, in a case where the opening degree $\theta$ after the opening degree step change is a low opening degree, $\tau$_dly and V/Se($\theta$) are represented by Expressions (11A) and (11B) below and V is represented as in Expression (12).

$$\tau\_dly = \{\gamma 0 + \sqrt{(\gamma 0^2 - 4\beta 0)}\}/2 \tag{11A}$$

$$V/Se(\theta) = \{\gamma 0 - \sqrt{(\gamma 0^2 - 4\beta 0)}\}/2 \tag{11B}$$

$$V = (\alpha 0/(Qin)\{\gamma 0 - \sqrt{(\gamma 0^2 - 4\beta 0)}\}/2 \tag{12}$$

Figure 5A:
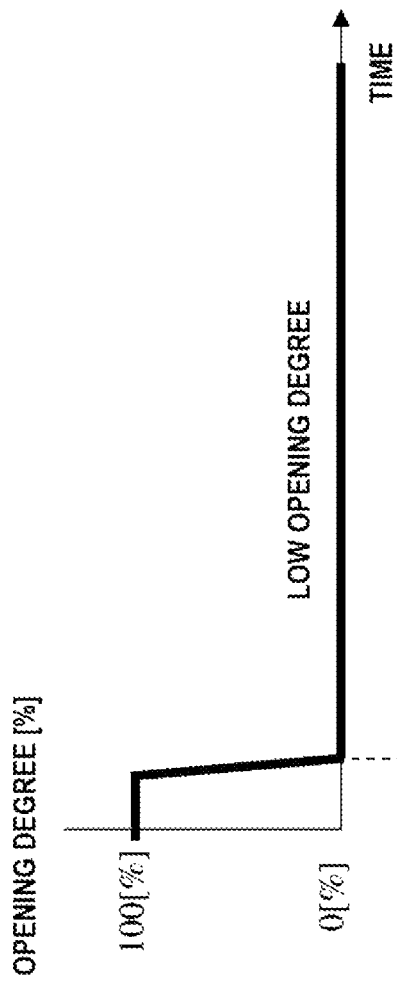
FIGS. 5A and 5B are graphs showing a change in the opening degree θ and a pressure measurement value Pm in a case where the opening degree θ is step-changed from a high opening degree (100%) to a low opening degree (0%)
Figure 5B:
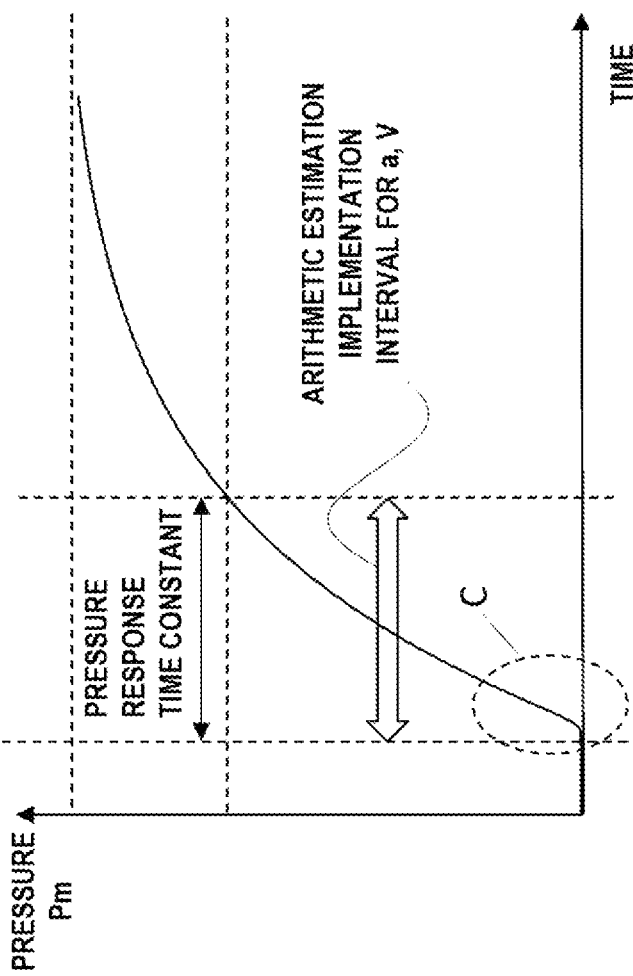

FIGS. 5A and 5B to 8 are graphs showing a change in the pressure measurement value Pm, the first-order derivative dPm/dt, and the second-order derivative d(dPm/dt)/dt after the opening degree $\theta$ has been step-changed. FIGS. 5A, 5B, and 6 are the graphs for describing a case where the opening degree $\theta$ has been step-changed from a high opening degree (100%) to a low opening degree (0%). FIG. 5A is the graph showing a change in the opening degree $\theta$, and FIG. 5B is the graph showing a change in the pressure measurement value Pm. When the opening degree $\theta$ is step-changed from 100% to 0% as in FIG. 5A, the pressure measurement value Pm changes as in FIG. 5B. Arithmetic estimation described above is performed in an interval indicated by a reference character C of FIG. 5B. That is, sampling of the pressure measurement value Pm and arithmetic estimation of the measurement lag time $\tau$_dly are performed in the middle of a change in the pressure response after the opening degree step change.

FIG. 6 is the graph showing the state of change in the area indicated by the reference character C of FIGS. 5A and 5B, i.e., an area in the arithmetic estimation interval, in more detail, a line L20 indicating the pressure measurement value Pm, a line L21 indicating the first-order derivative dPm/dt, and a line L22 indicating the second-order derivative d(dPm/dt)/dt. In the course of increasing the pressure, an area (an interval indicated by an arrow) where the second-order derivative d(dPm/dt)/dt changes from a positive value to a negative value is an optimal interval for arithmetic estimation of the measurement lag time $\tau$_dly based on the second-order differential equation of Expression (5). In this interval, arithmetic estimation of the measurement lag time $\tau$_dly is performed in every control cycle, and multiple values of $\tau$_dly obtained by arithmetic estimation are further averaged within the interval. In this manner, the measurement lag time $\tau$_dly is determined.

Figures 7A, 7B:
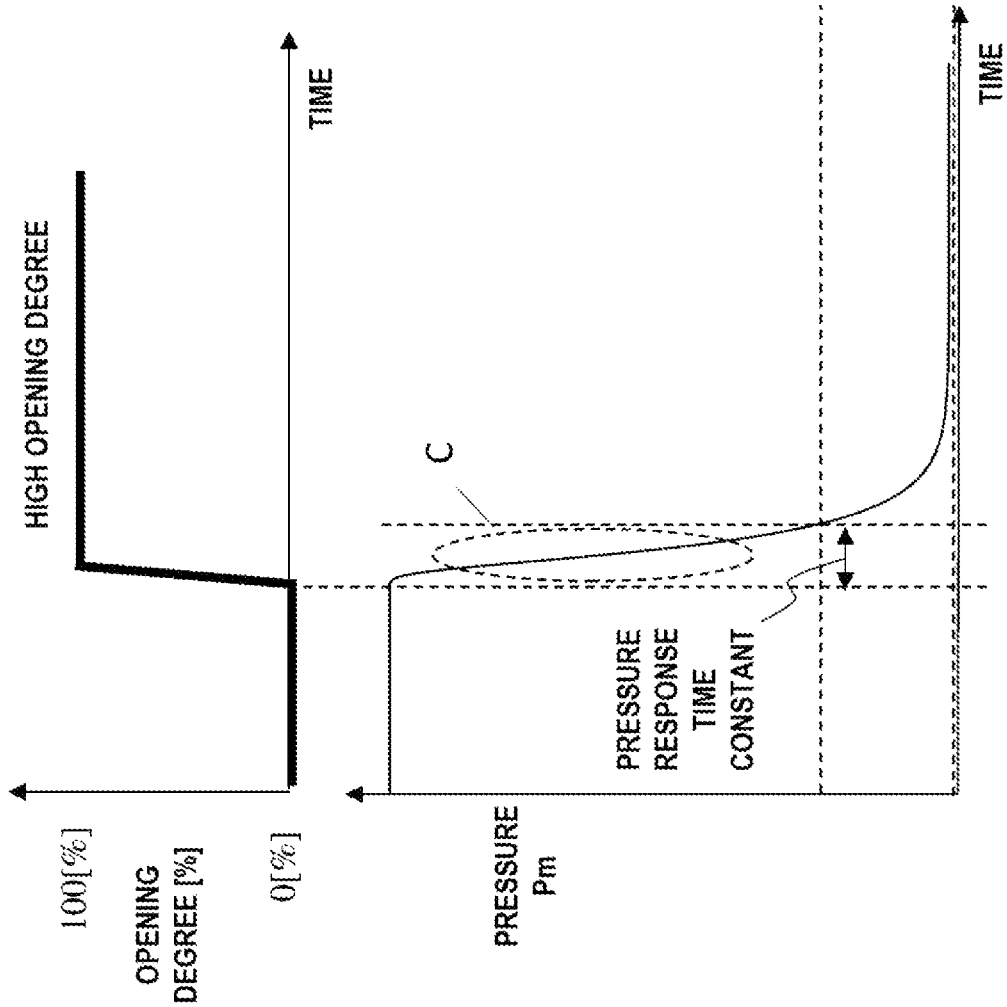
FIGS. 7A and 7B are graphs showing a change in the opening degree θ and the pressure measurement value Pm in a case where the opening degree θ is step-changed from a low opening degree (0%) to a high opening degree (100%)

FIGS. 7A, 7B, and 8 are the graphs for describing a case where the opening degree $\theta$ has been step-changed from a low opening degree (0%) to a high opening degree (100%). FIG. 7A is the graph showing an opening degree change, and FIG. 7B is the graph showing the pressure measurement value Pm.

Arithmetic estimation is performed in the interval indicated by the reference character C. That is, in the interval C, sampling of the pressure measurement value Pm and arithmetic estimation of the measurement lag time τ_dly are performed in the middle of a change in the pressure response after the opening degree step change.

FIG. 8 is the graph showing the state of change in the arithmetic estimation interval C of FIG. 7B in more detail. In FIG. 8, a line L30 indicates the pressure measurement value Pm, a line L31 indicates the first-order derivative dPm/dt, and a line L32 indicates the second-order derivative d(dPm/dt)/dt. In the course of decreasing the pressure, an area (an interval indicated by an arrow) where the second-order derivative d(dPm/dt)/dt changes from a negative value to a positive value is an optimal interval for arithmetic estimation of the measurement lag time τ_dly based on the second-order differential equation of Expression (5). In this interval, arithmetic estimation of the measurement lag time τ_dly is performed in every control cycle, and multiple values of τ_dly obtained by arithmetic estimation are further averaged within the interval. In this manner, the measurement lag time τ_dly is determined.

(1-3. Necessity of Second-Order Derivative Value)

As described above, in the present embodiment, arithmetic estimation of the measurement lag time τ_dly is also performed considering the second-order derivative value, which has been ignored in a typical case, of the pressure measurement value Pm. Hereinafter, the necessity of estimation taking the second-order derivative value of the pressure measurement value Pm into consideration for performing highly-accurate pressure adjustment control will be described.

Description will be made herein assuming general conditions where the chamber voltage V is normally of the order of about 10 L to 100 L and the effective exhaust speed Se(θ) is of the order of 10 L/s (a low opening degree) to 1000 L/s (a high opening degree). The time constant V/Se(θ) of the pressure response is of the order of about 0.01 s (=10 L÷1000 L/s) to 0.1 s (=100 L÷1000 L/s) in the case of a high opening degree after the opening degree step change in FIGS. 7A, 7B, and 8, and is the order of about 1 s (=10 L÷10 L/s) to 10 s (=100 L÷10 L/s) in the case of a low opening degree after the opening degree step change in FIGS. 5A, 5B, and 6.

Ideally, no lag (0 s) is most preferred as the measurement lag time τ_dly, and a user designs a vacuum meter connection structure such that the measurement lag time τ_dly is reduced as much as possible. Practically, the measurement lag time τ_dly needs to be reduced to the order of about 0.01 s to 1 s. Regarding a case where the measurement lag time τ_dly is a middle-level value of 0.1 s, the term "V/Se(θ)× τ_dly×d(dPm/dt)/dt" of the second-order derivative of the pressure measurement value Pm and the term "(V/Se(θ)+ τ_dly)×(dPm/dt)" of the first-order derivative of the pressure measurement value Pm on the right-hand side of Expression (5) above are compared with each other.

In a case where the chamber volume is a great volume (V=100 L), the time constant V/Se(θ) is of the order of 10 s in a pressure increase case (a low opening degree), and is of the order of 0.1 s in a pressure decrease case (a high opening degree). Regarding drive with the valve opening degree θ, a current valve device can be driven fast with the order of 0.1 s. A case where the opening degree has been changed fast as described above is equivalent to a case where the left-hand side of Expression (5) has been step-changed (Qin=Constant, Se(θ) has been step-changed). The magnitude of each derivative value on the right-hand side of Expression (5) right after such a step change is in a magnitude relationship as in Expression (13) below with reference to FIGS. 6 and 8.

$$|d(dPm/dt)| \gg |dPm/dt| \quad (13)$$

Further, the measurement lag time τ_dly is τ_dly=0.1 s, and the time constant V/Se(θ) is 10 s in the case of a low opening degree and is 0.1 s in the case of a high opening degree. Thus, the coefficients of d(dPm/dt)/dt and dPm/dt are 1 s and 10.1 s in the pressure increase case (a low opening degree), and are 0.01 s and 0.2 s in the pressure decrease case (a high opening degree). Thus, the magnitude of the term "V/Se(θ)×τ_dly×d(dPm/dt)/dt" of the second-order derivative and the magnitude of the term "(V/Se(θ)+τ_dly)× (dPm/dt)" of the first-order derivative are of the same order, and therefore, it is recognized that the term "V/Se(θ)× τ_dly×d(dPm/dt)/dt" of the second-order derivative cannot be ignored as in the term "(V/Se(θ)+τ_dly)×(dPm/dt)" of the first-order derivative and the term of Pm. Thus, a case where the second-order derivative term of the pressure is ignored as in the techniques described in Patent Literatures 1 and 2 is not proper when the measurement lag time is relatively short.

(First Variation: First Countermeasure against Noise Influence—Improvement in Accuracy of Measurement Lag Time τ_dly)

In the present embodiment, the measurement lag time τ_dly is estimated based on Expression (5) including the second-order derivative value of the pressure measurement value Pm. However, the second-order derivative value is greatly influenced by noise, and for this reason, signal SN ratio improvement such as averaging of the pressure measurement value Pm is also necessary for estimation accuracy improvement. Moreover, in the above-described estimation method, in the case of obtaining the measurement lag time τ_dly and the time constant V/Se(θ) of the pressure response, β0 and γ0 are first obtained by arithmetic estimation, and then, τ_dly and V/Se(θ) are obtained in such a manner that the quadratic equation taking β0 and γ0 as the coefficients is solved. The measurement lag time τ_dly is calculated in two stages as described above, and therefore, the estimation accuracy might be degraded specifically in the case of a short measurement lag time τ_dly. Ina first variation, an estimation method which is less susceptible to noise and has a higher estimation accuracy is provided.

When both sides of Expression (5) above are divided by V/Se(θ), Se(θ)=a×Se_Reference (θ) to which a later-described gas type characteristic value a has been applied is substituted into such an expression, and the resultant expression is rearranged, Expression (14) below is obtained.

$$\{1 + (a/V) \times \tau\_dly \times Se\_Reference(\theta)\} \times (dPm/dt) = \quad (14)$$
$$-(a/V) \times Pm \times Se\_Reference(\theta) +$$
$$Qin(1/V) - d(dPm/dt)/dt \times \tau\_dly$$

In Expression (14), (a/V), (1/V), and τ_dly are unknown amounts, and a second-order term with the unknown amount is on the left-hand side. Thus, Expression (14) is a non-linear expression. Note that the chamber volume v is about 10 L to 100 L, the gas type characteristic value a when Xe gas is the reference gas is within a range of 1 to 8.1, and the measurement lag time τ_dly is about 0.01 s to 1 s.

As described later, the measurement lag time τ_dly is shorter in the case of light gas than in the case of heavy gas, and is substantially in inverse proportion to the gas type characteristic value a. Thus, when the measurement lag time τ_dly is about 0.01 s to 1 s in the case of the Xe gas as the reference gas, a=1 is satisfied, and therefore, the value of a×τ_dly is about 0.01 s to 1 s. Similarly, (a/V)×τ_dly is about $10^{-4}$ to $10^{-2}$. Since Se_Reference (θ) is about 10 L/s in the case of a low opening degree, "(a/V)×τ_dly×Se_Reference(θ)" on the left-hand side of Expression (14) is (a/V)×τ_dly×Se_Reference (θ) 1. Thus, in the pressure increase case where the valve element opening degree is step-changed to a lower opening degree as in FIGS. 5A, 5B, and 6, "(a/V)×τ_dly×Se_Reference(θ)" on the left-hand side of Expression (14) is allowed to be ignored. As a result, in the pressure increase case where the valve element opening degree is step-changed to a lower opening degree, Expression (15) as a linearized approximate expression can be used instead of Expression (14).

$$dPm/dt = -(a/V) \times Pm \times \text{Se\_Reference}(\theta) + \\ Qin(1/V) - d(dPm/dt)/dt \times \tau\_dly \quad (15)$$

In Expression (15), Se_Reference (θ) is a known constant value at a low opening degree, and Qin is also a known constant value. Further, Pm, dPm/dt, and d(dPm/dt)/dt are observable known amounts, and therefore, Expression (15) is a linear expression in association with a variable (a/V, 1/V, τ_dly). As in the case of deformation from Expression (5) to Expression (6) as described above, when unknown numbers δ=a/V, ε=1/V, and ζ=τ_dly are introduced, Expression (15) can be deformed to Expression (16) below.

$$dPm/dt = \\ -\text{Se\_Reference}(\theta) \times Pm \times \delta + Qin \times \varepsilon - (d(dPm/dt)/dt) \times \zeta \quad (16)$$

When the estimation method in which the constant value (α0, β0, γ0) is obtained based on Expression (6) is also applied to Expression (16), (δ0, ε0, ζ0) for (δ, ε, ζ) can be obtained. For avoiding overlapping description, the details of arithmetic estimation will be omitted herein. Using the estimation result (δ0, ε0, ζ0), Gas Type Characteristic Value a=δ0/ε0, Chamber Volume V=1/ε0, and Measurement Lag Time τ_dly=ζ0 are obtained. As described above, in the first variation, the measurement lag time τ_dly most influenced by observation noise is not obtained by two-stage arithmetic processing as in the above-described embodiment, but is directly obtained. Thus, the estimation accuracy is improved.

As described above, sampling of the pressure measurement value Pm and arithmetic estimation of the measurement lag time τ_dly are performed in each control cycle in the interval (the interval indicated by the arrow of FIG. 6) in which the second-order derivative d(dPm/dt)/dt changes from the positive value to the negative value in the middle of a change in the pressure response. Further, the multiple values of τ_dly obtained by arithmetic estimation are further averaged within such an interval, and the estimation value is determined. Influence of the pressure second-order derivative on the gas type characteristic value a and the chamber volume V is relatively small, and therefore, each of estimation values of the gas type characteristic value a and the chamber volume V obtained in each control cycle may be taken as a determined value when each estimation value converges to a constant value. The estimation interval in this case may be, as a rough indication, a short response period with about the time constant (=V/Se(θ0)) of the pressure response at longest (see FIGS. 5A and 5B).

(Second Variation: Second Countermeasure against Noise Influence—Improvement in Accuracy of Measurement Lag Time τ_dly)

In the above-described first variation, the gas type characteristic value a, the chamber volume V, and the measurement lag time τ_dly as three unknown characteristic values are obtained by arithmetic estimation based on Expression (16) approximately satisfied in the course of the pressure increase response to the step change to a lower opening degree. In a second variation, the method for estimating the measurement lag time τ_dly with favorable accuracy in a case where the gas type characteristic value a and the chamber volume V, which can be obtained with favorable accuracy, of the gas type characteristic value a, the chamber volume V, and the measurement lag time τ_dly are obtained as prior information will be described. Note that the method allowing higher-accuracy arithmetic estimation in the first variation, i.e., arithmetic estimation based on Approximate Expression (16) in the pressure increase case where the opening degree is step-changed to a lower opening degree, is applied as the estimation technique.

It is assumed that the gas type characteristic value a and the chamber volume V obtained as the prior information are represented as in a_pre and V_pre. As in the case of the first variation, K sample planes "d4$k$=d1$k$×δ+d2$k$×ε+d3$k$×ζ" based on Expression (16) are obtained for multiple samples (k=1, 2, ..., K) acquired in the middle of the response. In the second variation, M1 planes δ=a_pre and M2 planes ε=V_pre based on the prior information are also added to these K sample planes. For example, in the case of K=10, M1=1, and M2=1, $\Sigma Lk^2$ is calculated for 10 sample planes in the case of the first variation, but is calculated for 12 planes, which includes Plane δ=a_pre/V_pre and Plane ε=1/V_pre in addition to 10 sample planes, in the second variation. The case of K=10, M1=1, and M2=1 has been described herein, but M1 and M2 do not actually need to be integers because M1 and M2 are values for weighting for K, i.e., weighting of the prior information for post information. As a rough indication for a moderate degree of influence without dominance of the prior information, M1 and M2 may be values of about 1/10 to 1/1000 of K. For example, M1=M2=0.1 (=10/100) is satisfied as one example of the rough indication in the case of K=10.

It is assumed that simultaneous equations with three variables in a case where no sample plane for the prior information is added are Expressions (17A) to (17C) below.

$$D1 = A1 \times \delta 0 + B1 \times \varepsilon 0 + C1 \times \zeta 0 \quad (17A)$$

$$D2 = A2 \times \delta 0 + B2 \times \varepsilon 0 + C2 \times \zeta 0 \quad (17B)$$

$$D3 = A3 \times \delta 0 + B3 \times \varepsilon 0 + C3 \times \zeta 0 \quad (17C)$$

At this point, simultaneous equations with three variables in a case where the planes for the prior information are added to the sample planes are Expressions (18A) to (18C).

$$D1 + (a\_pre/V\_pre) \times M1 = (A1 + M1) \times \delta 0 + B1 \times \varepsilon 0 + C1 \times \zeta 0 \quad (18A)$$

$$D2 + (1/V\_pre) \times M2 = A2 \times \delta 0 + (B2 + M2) \times \varepsilon 0 + C2 \times \zeta 0 \quad (18B)$$

$$D3 = A3 \times \delta 0 + B3 \times \varepsilon 0 + C3 \times \zeta 0 \quad (18C)$$

By solving Simultaneous Equations (18A) to (18C) in a case where the planes for the prior information are added as the samples, ($\delta 0$, $\varepsilon 0$, $\zeta 0$) is obtained, and the measurement lag time $\tau\_dly$ ($=U$) can be obtained by arithmetic estimation with a higher estimation accuracy than that of the first variation. Note that the method for acquiring the gas type characteristic value a and the chamber volume V as the prior information is not limited, data may be input in advance or these values may be estimated by other estimation methods. For example, the processing of estimating the gas type characteristic value a and the chamber volume V as the prior information by the estimation method described in the first variation is first performed. Then, based on such prior information, the measurement lag time $\tau\_dly$, the gas type characteristic value a, and the chamber volume V are estimated by the estimation method of the second variation as described above.

(1-4. Gas Characteristic Information at Low Opening Degree)

In a molecular flow area, a relationship of $C \propto 1/\sqrt{M}$ is satisfied between a gas molecular weight M and a valve conductance C. As described with reference to FIG. 4, the effective exhaust speed Se($\theta$) is substantially coincident with the valve conductance value in the area (a low-opening-degree area) where the opening degree $\theta$ is low. A ratio (Se/Se_Reference) of an effective exhaust speed Se for an optional gas type (the molecular weight M) and the effective exhaust speed Se_Reference regarding the gas type (a molecular weight M0) set as the reference gas is represented as $\sqrt{(M0/M)}$. That is, Se=a×Se_Reference and a=$\sqrt{(M0/M)}$ are satisfied. Hereinafter, a=$\sqrt{(M0/M)}$ will be referred to as the gas type characteristic value.

The selected reference gas may be of any gas type. For example, assuming that xenon (Xe) with Molecular Weight M=131 is taken as the reference and a range of M=2 ($H^2$) to M=131 (Xe) is taken as an assumed gas type range, a=1 (=$\sqrt{(131/131)}$) to 8.1 (=$\sqrt{(131/2)}$) is satisfied. Note that in the case of use of gas with M=131 or greater, there is no specific limitation on expansion of a heavier-gas range. When a relationship of Se=a×Se_Reference is substituted into Se($\theta$)= $\alpha 0$/Qin obtained by arithmetic estimation described above, a=$\alpha 0$/(Qin×Se_Reference($\theta$)) is satisfied, and the gas type characteristic value a can be also estimated. As a result, the measurement lag time $\tau\_dly$, the chamber volume V, and the gas type characteristic value a can be estimated together. Note that the correlation data Se($\theta$) Reference between the opening degree $\theta$ and the effective exhaust speed regarding the reference gas type for defining the gas type characteristic value a is stored in the storage section 23 of the valve controller 20.

(1-5. Introduction of Measurement Lag Time $\tau\_dly$ Reference as Reference)

Figure 9:
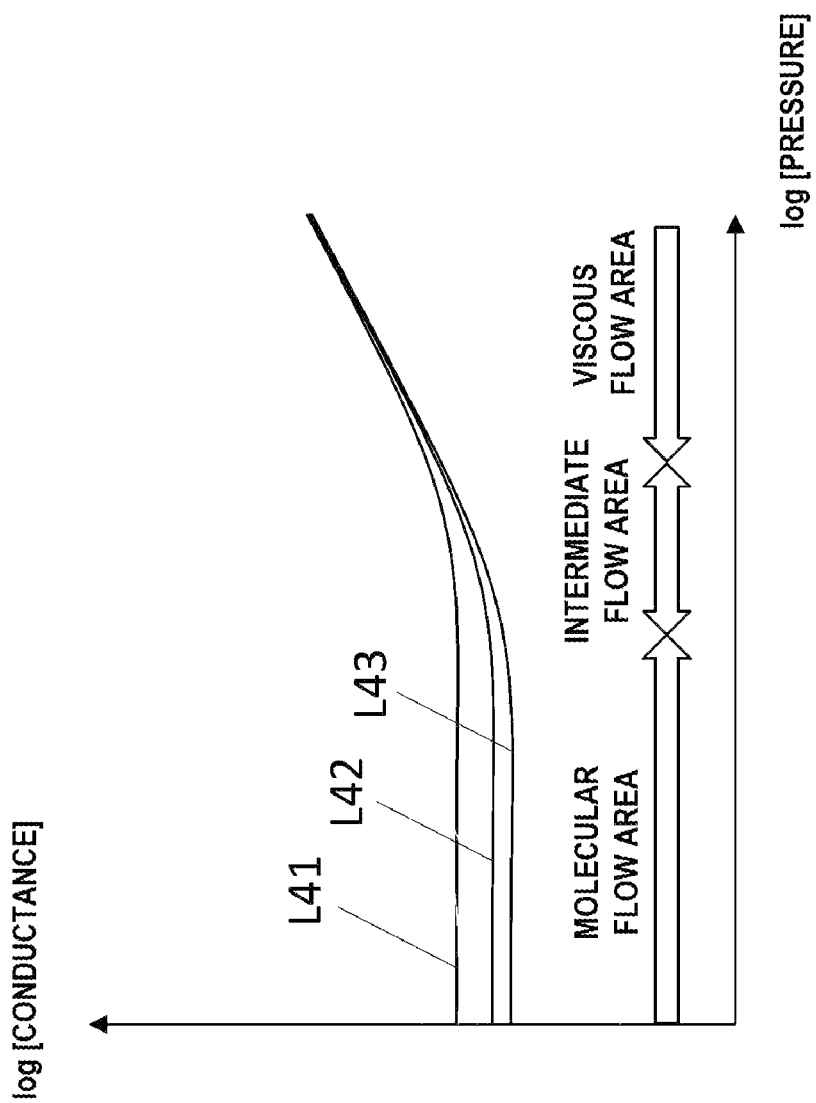
FIG. 9 is a graph showing a relationship between a conductance and a pressure.

As described above, in a case where the opening degree $\theta$ is a low opening degree, the effective exhaust speed Se($\theta$) is substantially coincident with the valve conductance value. FIG. 9 is a graph showing a relationship between the conductance and the pressure. In FIG. 9, a line L41 indicates He gas, a line L42 indicates Ar gas, and a line L43 indicates Xe gas. In the molecular flow area, the conductance varies according to the molecular weight M, and a conductance difference decreases as the pressure increases to an intermediate flow area and a viscous flow area.

Normally, in a semiconductor process, a pipe conductance Cg for determining the measurement lag time also substantially has the characteristics (Conductance Value $\propto 1/\sqrt{\text{Molecular Weight}}$) in the molecular flow area. For example, even in a special case where a pipe volume is extremely great, the pipe conductance Cg exhibits the characteristics in the intermediate flow area at the highest, and little exhibits the characteristics in the viscous flow area. In the case of the molecular flow area, the ratio of a pipe conductance Cg for the optional gas type (the molecular weight M) to a pipe conductance Cg_Reference for the gas type (the molecular weight M0) as the reference is Cg/Cg_Reference=$\sqrt{(M0/M)}$=a. The measurement lag time $\tau\_dly$ is in inverse proportion to the pipe conductance Cg, and therefore, a relationship between the measurement lag time $\tau\_dly$ in the case of the optional gas type and the measurement lag time (hereinafter referred to as a reference measurement lag time $\tau\_dly$ Reference) in the case of the gas type as the reference is as in Expression (19) below.

$$\tau\_dly = \tau\_dly\_Reference/a \quad (19)$$

As described above, as long as the measurement lag time $\tau\_dly$ and the gas type characteristic value a are calculated based on the sampling data in the middle of the response, the reference measurement lag time $\tau\_dly$ Reference can be calculated from these arithmetic processing results and Expression (19). For example, in the first variation, estimation is made as in Gas Type Characteristic Value a=$\delta 0/\varepsilon 0$ and Measurement Lag Time $\tau\_dly$=$\zeta 0$. Thus, the reference measurement lag time $\tau\_dly$ Reference can be obtained according to Expression (20) below.

$$\tau\_dly\_Reference = a \times \tau\_dly = (\delta 0/\varepsilon 0) \times \zeta 0 \quad (20)$$

(Third Variation: Other Methods for Estimating Reference Measurement Lag Time $\tau\_dly$ Reference)

In derivation of Expression (20), the pipe conductance Cg has the characteristics (Conductance Value $\propto 1/\sqrt{\text{Molecular Weight}}$) in the molecular flow area. In a third variation, the case of the intermediate flow area will be discussed. In the intermediate flow area, the pipe conductance Cg can be represented as in Cg$\propto$M^(-1/m) (note that m>2) in relation to the molecular weight M of the gas type. Since m is a value close to two, it is normally enough to employ Expression (20). However, estimation is made as follows for more precisely setting the pipe conductance Cg.

In estimation, two types of gas with different molecular weights (assumed as molecular weights M1, M2) are used. The gas with the molecular weight M1 is applied to estimate a measurement lag time $\tau\_dly$(M1), and then, the gas with the molecular weight M2 is applied to estimate a measurement lag time $\tau\_dly$(M2). As described above, the measurement lag time $\tau\_dly$ is in inverse proportion to the pipe conductance Cg, and Cg$\propto$M^(-1/m):m>2 is satisfied in the intermediate flow area. Thus, Expression (21) below is obtained, and the value of m is estimated according to Expression (22).

$$\tau\_dly(M2)/\tau\_dly(M1) = /Cg(M1)/Cg(M2) = (M2/M1)^{\wedge}(1/m) \quad (21)$$

$$1/m = \ln(\tau\_dly(M2)/\tau\_dly(M1))/\ln(M2/M1) \quad (22)$$

At this point, when the molecular weight of the reference gas type is represented as M Reference, the reference measurement lag time τ_dly Reference regarding the reference gas type according to Expression (21) is obtained according to Expression (23) below. Expression (22) gives (1/m) on the right-hand side. In a case where the reference gas type can be injected, τ_dly Reference is directly obtained by simple arithmetic estimation.

$$\tau\_dly\_Reference = (M\_Reference/M1)^{\wedge}(1/m) \times \tau\_dly(M1) \quad (23)$$

(1-6. Control Based on τ_Dly Reference)

As described above, the measurement lag element associated with the measurement lag time τ_dly is a primary lag element, and such a transfer function is expressed as in $(1/\tau\_dly)/\{S+(1/\tau\_dly)\}$ (where S is a Laplace transform complex number). As shown in Expression (19), τ_dly=τ_dly Reference/a is satisfied, and therefore, the primary lag element is represented as in Expression (24) below and the measurement lag time is shorter in the case of a lighter gas type with a greater value of the gas type characteristic value a.

$$(a/\tau\_dly\_Reference)/\{S + (a/\tau\_dly\_Reference)\} \quad (24)$$

Figure 10:
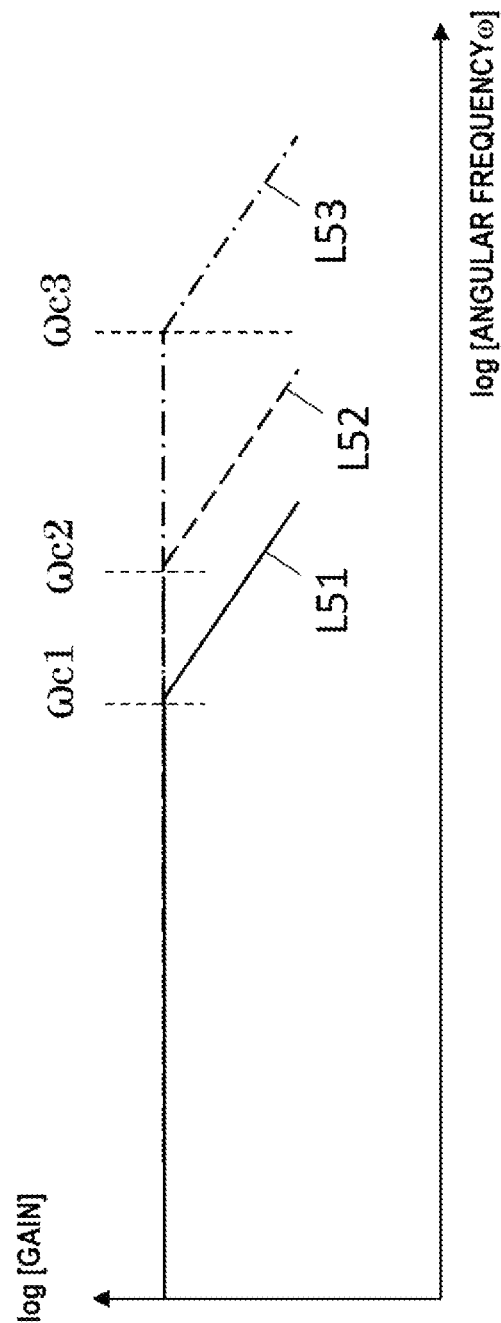
FIG. 10 is a Bode diagram showing the gain of the transfer function of a measurement lag element.

Assuming that the reference gas is Xe and the range of the molecular weight of the gas type assumed to be used is equal to or less than the molecular weight of Xe (Xe to $H^2$), the value of the gas type characteristic value a of Expression (24) is within a range of 1 to 8.1. The gain of the transfer function of the measurement lag element is plotted on a Bode diagram in FIG. 10, the vertical axis representing the gain and the horizontal axis representing an angular frequency co. As shown in FIG. 10, there is a difference of about eight folds in a corner frequency ωc (=a/τ_dly Reference) among gas types.

Thus, as in a transfer function indicated by a line L61 of FIG. 11A, when the lag correction is strongly made according to Xe as heavy gas with a=1, the lag correction appropriate for Xe is made as shown in FIG. 11B. However, for $H^2$ as light gas with a=8.1, a high-frequency gain become excessive, and an adverse effect that an oscillation phenomenon occurs is caused. The injected gas cannot be known in advance in a manufacturing process, and it is not easy to estimate the injected gas for each process event. For this reason, the lag correction cannot be made according to the process gas.

Figure 12A:
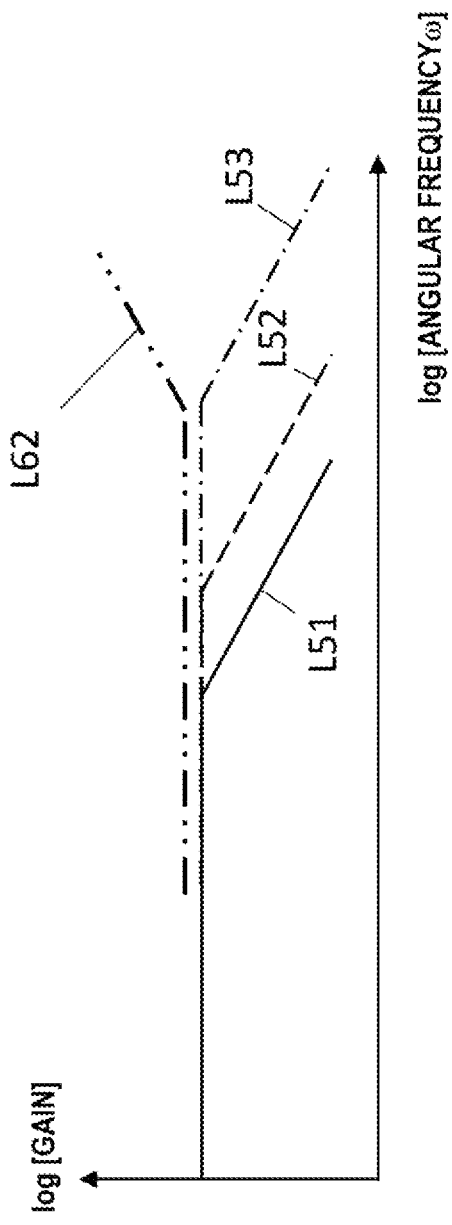
FIGS. 12A and 12B are graphs showing one example of proper lag correction.
Figure 12B:
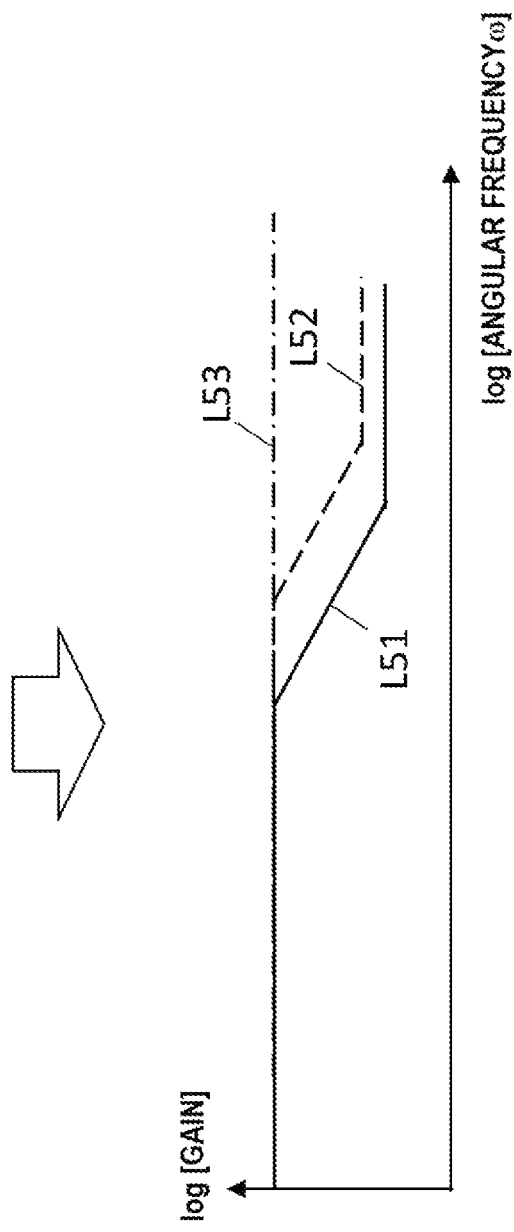

Thus, for ensuring a sufficient control stability margin, lag correction L62 is made according to the light gas (the $H^2$ gas) within an assumed use range as shown in FIGS. 12A and 12B. Although the correction is insufficient for the heavy gas such as Xe, it is reasonable to suppress correction weak. In the case of performing such lag correction in the lag correction block of FIG. 2, a control parameter (a lag correction time) is adjusted based on the measurement lag time τ_dly Reference for the reference gas type regardless of the type of gas injected upon estimation, i.e., the measurement lag time τ_dly Reference obtained by arithmetic estimation in the estimation section 210. Alternatively, the control parameter may be selected from multiple control parameters prepared in advance. That is, accurate adjustment/setting to a proper control parameter can be automatically performed without the need for manually adjusting the control parameter for the lag correction by trial and error by the user.

Note that in the above-described embodiment, the pressure measurement value Pm is corrected based on the measurement lag time τ_dly Reference, and the pressure adjustment control is corrected by feedback of the corrected pressure measurement value Pm. However, instead of correction of the pressure measurement value Pm to be fed back, such as secondary lead compensation of control as described in Patent Literature 2, primary lead compensation may be performed based on the measurement lag time τ_dly Reference.

Those skilled in the art understand that the above-described exemplary embodiment and examples are specific examples of the following aspects.

[1] A vacuum valve comprises: a valve main body attached to between a vacuum pump and a vacuum chamber; and a controller. The controller includes an opening degree control section configured to control a valve element opening degree of the valve main body based on a pressure measurement value of the vacuum chamber measured by a vacuum meter, and an estimation section configured to estimate measurement lag information of pressure measurement value with respect to a pressure of the vacuum chamber based on (a) an exhaust expression including a second-order derivative term of the pressure measurement value and indicating a relationship between an effective exhaust speed of a vacuum pumping system for the vacuum chamber and the pressure measurement value and (b) a pressure measurement value measured during a pressure response when the valve element opening degree is step-changed, and the opening degree control section controls the valve element opening degree based on the measurement lag information estimated by the estimation section.

Expression (5) derived from the exhaust expression includes the second-order derivative term of the pressure measurement value Pm, and represents the relationship between the effective exhaust speed Se of a vacuum pumping system for the vacuum chamber 3 and the pressure measurement value Pm. Measurement lag information (the measurement lag time τ_dly) is estimated based on Expression (5) including the second-order derivative term of the pressure measurement value Pm and the pressure measurement value measured during the pressure response when the valve element opening degree is step-changed. In this manner, the estimation accuracy can be more improved as compared to a measurement lag amount estimated from an exhaust expression excluding a second-order derivative term as in the typical case. As a result, the pressure adjustment control by the vacuum valve can be more properly performed.

[2] The controller further has a memory configured to store correlation data between the valve element opening degree and the effective exhaust speed regarding a known gas type. The estimation section estimates, in addition to estimation of the measurement lag information, a gas type characteristic value of gas injected into the vacuum chamber based on the correlation data. The opening degree control section controls the valve element opening degree based on the estimated measurement lag information and the estimated gas type characteristic value.

Even the gas type characteristic value relating to the measurement lag information can be also obtained by arithmetic estimation, and does not need to be obtained separately.

[3] The estimation section further estimates, in addition to estimation of the measurement lag information, a gas type characteristic value of gas injected into the vacuum chamber and a volume of the vacuum chamber based on an exhaust expression linearized by application of an effective exhaust speed regarding a known gas type to the exhaust expression and a pressure measurement value measured during a pressure response when the valve element opening degree decreases. The opening degree control section controls the valve element opening degree based on the estimated measurement lag information and the estimated gas type characteristic value.

Arithmetic estimation is performed based on Exhaust Expression (15) linearized by application of the effective exhaust speed Se_Reference (θ) regarding the known gas type to Exhaust Expression (5), and in this manner, the accuracy of estimation of the measurement lag information (the measurement lag time τ_dly) most influenced by the observation noise is improved.

[4] The estimation section performs (c) first estimation processing for estimating the measurement lag information, the gas type characteristic value, and the vacuum chamber volume based on the linearized exhaust expression and the pressure measurement value measured during the pressure response when the valve element opening degree decreases, and (d) second estimation processing for estimating measurement lag information, a gas type characteristic value, and a vacuum chamber volume again based on the linearized exhaust expression, the gas type characteristic value and the vacuum chamber volume estimated by the first estimation processing, and the pressure measurement value measured during the pressure response when the valve element opening degree decreases. The opening degree control section controls the valve element opening degree based on the measurement lag information and the gas type characteristic value estimated by the second estimation processing.

In the case of performing arithmetic estimation based on the linearized exhaust expression, the measurement lag information and the gas type characteristic value may be obtained by arithmetic estimation based on the gas type characteristic value a_pre and the chamber volume V_pre obtained in advance and the pressure measurement value Pm measured during the pressure response. With this configuration, the accuracy of estimation of the measurement lag information (the measurement lag time τ_dly) is improved.

[5], [6] The estimation section estimates reference measurement lag information as measurement lag information regarding the known gas type based on the estimated measurement lag information and the estimated gas type characteristic value. The opening degree control section controls the valve element opening degree based on the reference measurement lag information.

As described above, the reference measurement lag information (the reference measurement lag time τ_dly Reference) regarding the known gas type may be estimated, and the valve element opening degree may be controlled based on the reference measurement lag information.

[7] An estimation device for estimating measurement lag information of a pressure measurement value of a vacuum meter configured to measure a pressure of a vacuum chamber, from which gas is pumped by a vacuum pump through a vacuum valve, with respect to the pressure of the vacuum chamber, comprises: a controller. The controller estimates the measurement lag information based on (a) an exhaust expression including a second-order derivative term of the pressure measurement value and indicating a relationship between an effective exhaust speed of a vacuum pumping system for the vacuum chamber and the pressure measurement value and (b) a pressure measurement value measured during a pressure response when a valve element opening degree is step-changed.

The estimation accuracy can be more improved as compared to the measurement lag amount estimated from the exhaust expression excluding the second-order derivative term as in the typical case.

[8] A method of controlling a vacuum valve comprises: an opening degree control step to control a valve element opening degree of the valve main body based on a pressure measurement value of the vacuum chamber measured by a vacuum meter, and an estimation step to estimate measurement lag information of pressure measurement value with respect to a pressure of the vacuum chamber based on (a) an exhaust expression including a second-order derivative term of the pressure measurement value and indicating a relationship between an effective exhaust speed of a vacuum pumping system for the vacuum chamber and the pressure measurement value and (b) a pressure measurement value measured during a pressure response when the valve element opening degree is step-changed. The opening degree control step controls the valve element opening degree based on the measurement lag information estimated by the estimation section.

[9] The estimation step estimates, in addition to estimation of the measurement lag information, a gas type characteristic value of gas injected into the vacuum chamber based on a correlation data, the correlation data being between the valve element opening degree and the effective exhaust speed regarding a known gas type. The opening degree control step controls the valve element opening degree based on the estimated measurement lag information and the estimated gas type characteristic value.

[10] The estimation step further estimates, in addition to estimation of the measurement lag information, a gas type characteristic value of gas injected into the vacuum chamber and a volume of the vacuum chamber based on an exhaust expression linearized by application of an effective exhaust speed regarding a known gas type to the exhaust expression and a pressure measurement value measured during a pressure response when the valve element opening degree decreases. The opening degree control step controls the valve element opening degree based on the estimated measurement lag information and the estimated gas type characteristic value.

[11] The estimation step performs (c) first estimation processing for estimating the measurement lag information, the gas type characteristic value, and the vacuum chamber volume based on the linearized exhaust expression and the pressure measurement value measured during the pressure response when the valve element opening degree decreases, and (d) second estimation processing for estimating measurement lag information, a gas type characteristic value, and a vacuum chamber volume again based on the linearized exhaust expression, the gas type characteristic value and the vacuum chamber volume estimated by the first estimation processing, and the pressure measurement value measured during the pressure response when the valve element opening degree decreases. The opening degree control step controls the valve element opening degree based on the measurement lag information and the gas type characteristic value estimated by the second estimation processing.

[12], [13] The estimation step estimates reference measurement lag information as measurement lag information regarding the known gas type based on the estimated measurement lag information and the estimated gas type characteristic value. The opening degree control step controls the valve element opening degree based on the reference measurement lag information.

The various embodiments and the variations have been described above, but the present invention is not limited to the contents of these embodiments and variations. Other aspects conceivable within the scope of the technical idea of the present invention are also included in the scope of the present invention. For example, in the above-described embodiment, the estimation section 210 is provided in the valve controller 20, but the estimation section 210 may be an estimation device independently of the valve controller 20 or may be included in an upper controller configured to control the entirety of the vacuum pumping system.

What is claimed is:

1. A vacuum valve comprising:
a valve main body attached to between a vacuum pump and a vacuum chamber; and
a controller,
wherein the controller includes
an opening degree control section configured to control a valve element opening degree of the valve main body based on a pressure measurement value of the vacuum chamber measured by a vacuum meter, and
an estimation section configured to estimate measurement lag information of pressure measurement value with respect to a pressure of the vacuum chamber based on (a) an exhaust expression including a second-order derivative term of the pressure measurement value and indicating a relationship between an effective exhaust speed of a vacuum pumping system for the vacuum chamber and the pressure measurement value and (b) a pressure measurement value measured during a pressure response when the valve element opening degree is step-changed, and
the opening degree control section controls the valve element opening degree based on the measurement lag information estimated by the estimation section.

2. The vacuum valve according to claim 1, wherein
the controller further has a memory configured to store correlation data between the valve element opening degree and the effective exhaust speed regarding a known gas type,
the estimation section estimates, in addition to estimation of the measurement lag information, a gas type characteristic value of gas injected into the vacuum chamber based on the correlation data, and
the opening degree control section controls the valve element opening degree based on the estimated measurement lag information and the estimated gas type characteristic value.

3. The vacuum valve according to claim 1, wherein
the estimation section further estimates, in addition to estimation of the measurement lag information, a gas type characteristic value of gas injected into the vacuum chamber and a volume of the vacuum chamber based on an exhaust expression linearized by application of an effective exhaust speed regarding a known gas type to the exhaust expression and a pressure measurement value measured during a pressure response when the valve element opening degree decreases, and the opening degree control section controls the valve element opening degree based on the estimated measurement lag information and the estimated gas type characteristic value.

4. The vacuum valve according to claim 3, wherein
the estimation section performs
(c) first estimation processing for estimating the measurement lag information, the gas type characteristic value, and the vacuum chamber volume based on the linearized exhaust expression and the pressure measurement value measured during the pressure response when the valve element opening degree decreases, and
(d) second estimation processing for estimating measurement lag information, a gas type characteristic value, and a vacuum chamber volume again based on the linearized exhaust expression, the gas type characteristic value and the vacuum chamber volume estimated by the first estimation processing, and the pressure measurement value measured during the pressure response when the valve element opening degree decreases, and
the opening degree control section controls the valve element opening degree based on the measurement lag information and the gas type characteristic value estimated by the second estimation processing.

5. The vacuum valve according to claim 2, wherein
the estimation section estimates reference measurement lag information as measurement lag information regarding the known gas type based on the estimated measurement lag information and the estimated gas type characteristic value, and
the opening degree control section controls the valve element opening degree based on the reference measurement lag information.

6. The vacuum valve according to claim 3, wherein
the estimation section estimates reference measurement lag information as measurement lag information regarding the known gas type based on the estimated measurement lag information and the estimated gas type characteristic value, and
the opening degree control section controls the valve element opening degree based on the reference measurement lag information.

7. An estimation device for estimating measurement lag information of a pressure measurement value of a vacuum meter configured to measure a pressure of a vacuum chamber, from which gas is pumped by a vacuum pump through a vacuum valve, with respect to the pressure of the vacuum chamber, comprising:
a controller,
wherein the controller
estimates the measurement lag information based on (a) an exhaust expression including a second-order derivative term of the pressure measurement value and indicating a relationship between an effective exhaust speed of a vacuum pumping system for the vacuum chamber and the pressure measurement value and (b) a pressure measurement value measured during a pressure response when a valve element opening degree is step-changed.

8. A method of controlling a vacuum valve comprising:
an opening degree control step to control a valve element opening degree of the valve main body based on a pressure measurement value of the vacuum chamber measured by a vacuum meter, and
an estimation step to estimate measurement lag information of pressure measurement value with respect to a pressure of the vacuum chamber based on (a) an exhaust expression including a second-order derivative term of the pressure measurement value and indicating a relationship between an effective exhaust speed of a vacuum pumping system for the vacuum chamber and the pressure measurement value and (b) a pressure measurement value measured during a pressure response when the valve element opening degree is step-changed, wherein the opening degree control step controls the valve element opening degree based on the measurement lag information estimated by the estimation section.

9. The method according to claim 8, wherein the estimation step estimates, in addition to estimation of the measurement lag information, a gas type characteristic value of gas injected into the vacuum chamber based on a correlation data, the correlation data being between the valve element opening degree and the effective exhaust speed regarding a known gas type, and the opening degree control step controls the valve element opening degree based on the estimated measurement lag information and the estimated gas type characteristic value.

10. The method according to claim 8, wherein the estimation step further estimates, in addition to estimation of the measurement lag information, a gas type characteristic value of gas injected into the vacuum chamber and a volume of the vacuum chamber based on an exhaust expression linearized by application of an effective exhaust speed regarding a known gas type to the exhaust expression and a pressure measurement value measured during a pressure response when the valve element opening degree decreases, and the opening degree control step controls the valve element opening degree based on the estimated measurement lag information and the estimated gas type characteristic value.

11. The method according to claim 10, wherein the estimation step performs (c) first estimation processing for estimating the measurement lag information, the gas type characteristic value, and the vacuum chamber volume based on the linearized exhaust expression and the pressure measurement value measured during the pressure response when the valve element opening degree decreases, and (d) second estimation processing for estimating measurement lag information, a gas type characteristic value, and a vacuum chamber volume again based on the linearized exhaust expression, the gas type characteristic value and the vacuum chamber volume estimated by the first estimation processing, and the pressure measurement value measured during the pressure response when the valve element opening degree decreases, and the opening degree control step controls the valve element opening degree based on the measurement lag information and the gas type characteristic value estimated by the second estimation processing.

12. The method according to claim 9, wherein the estimation step estimates reference measurement lag information as measurement lag information regarding the known gas type based on the estimated measurement lag information and the estimated gas type characteristic value, and the opening degree control step controls the valve element opening degree based on the reference measurement lag information.

13. The method according to claim 10, wherein the estimation step estimates reference measurement lag information as measurement lag information regarding the known gas type based on the estimated measurement lag information and the estimated gas type characteristic value, and the opening degree control step controls the valve element opening degree based on the reference measurement lag information.

\* \* \* \* \*